United States Patent
Naito

(10) Patent No.: US 10,559,663 B2
(45) Date of Patent: Feb. 11, 2020

(54) SEMICONDUCTOR DEVICE WITH IMPROVED CURRENT FLOW DISTRIBUTION

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 15/782,887

(22) Filed: Oct. 13, 2017

(65) Prior Publication Data
US 2018/0108737 A1   Apr. 19, 2018

(30) Foreign Application Priority Data

Oct. 14, 2016  (JP) ................................. 2016-203146
May 1, 2017  (JP) ................................. 2017-091414

(51) Int. Cl.
*H01L 27/07* (2006.01)
*H01L 29/06* (2006.01)
(Continued)

(52) U.S. Cl.
CPC ...... *H01L 29/1087* (2013.01); *H01L 27/0716* (2013.01); *H01L 27/0727* (2013.01); *H01L 29/0615* (2013.01); *H01L 29/0834* (2013.01); *H01L 29/1095* (2013.01); *H01L 29/32* (2013.01); *H01L 29/404* (2013.01);
(Continued)

(58) Field of Classification Search
CPC ............. H01L 29/1087; H01L 29/0615; H01L 29/4238; H01L 29/407; H01L 29/404; H01L 29/0696; H01L 27/0727; H01L 29/8613; H01L 29/0834; H01L 27/0716; H01L 29/1095; H01L 29/32; H01L 29/7397; H01L 29/0619
See application file for complete search history.

(56) References Cited

U.S. PATENT DOCUMENTS

2014/0361333 A1   12/2014  Kimura et al.
2015/0144995 A1   5/2015   Takahashi et al.
(Continued)

FOREIGN PATENT DOCUMENTS

JP   2013089874 A   5/2013
JP   2015103697 A   6/2015
(Continued)

*Primary Examiner* — William F Kraig
*Assistant Examiner* — Vicki B. Booker

(57) ABSTRACT

A semiconductor device is provided, including: a semiconductor substrate; a transistor section provided in the semiconductor substrate; and a diode section provided in the semiconductor substrate being adjacent to the transistor section, wherein the diode section includes: a second conductivity-type anode region; a first conductivity-type drift region; a first conductivity-type cathode region; a plurality of dummy trench portions arrayed along a predetermined array direction; a contact portion provided along an extending direction of the plurality of dummy trench portions that is different from the array direction; and a lower-surface side semiconductor region provided directly below a portion of the contact portion at an outer end in the extending direction.

26 Claims, 23 Drawing Sheets

(51) Int. Cl.
- *H01L 29/08* (2006.01)
- *H01L 29/10* (2006.01)
- *H01L 29/32* (2006.01)
- *H01L 29/40* (2006.01)
- *H01L 29/423* (2006.01)
- *H01L 29/739* (2006.01)
- *H01L 29/861* (2006.01)

(52) U.S. Cl.
CPC ........ *H01L 29/407* (2013.01); *H01L 29/4238* (2013.01); *H01L 29/7397* (2013.01); *H01L 29/8613* (2013.01)

(56) References Cited

U.S. PATENT DOCUMENTS

2016/0111419 A1* 4/2016 Naito .................. H01L 27/0716 257/140
2016/0141400 A1   5/2016 Takahashi
2016/0336435 A1* 11/2016 Naito .................. H01L 29/7397
2016/0351561 A1* 12/2016 Senoo .................. H01L 29/872
2017/0025410 A1   1/2017 Cheng et al.
2017/0077216 A1   3/2017 Kouno
2017/0084610 A1   3/2017 Kouno
2017/0162560 A1   6/2017 Takahashi
2017/0317175 A1* 11/2017 Naito .................... H01L 29/407

FOREIGN PATENT DOCUMENTS

| | | |
|---|---|---|
| JP | 2015135954 A | 7/2015 |
| JP | 2015185742 A | 10/2015 |
| JP | 2016096222 A | 5/2016 |
| JP | 2017059711 A | 3/2017 |
| WO | 2013110994 A1 | 8/2013 |
| WO | 2015093038 A1 | 6/2015 |
| WO | 2016030966 A1 | 3/2016 |

* cited by examiner

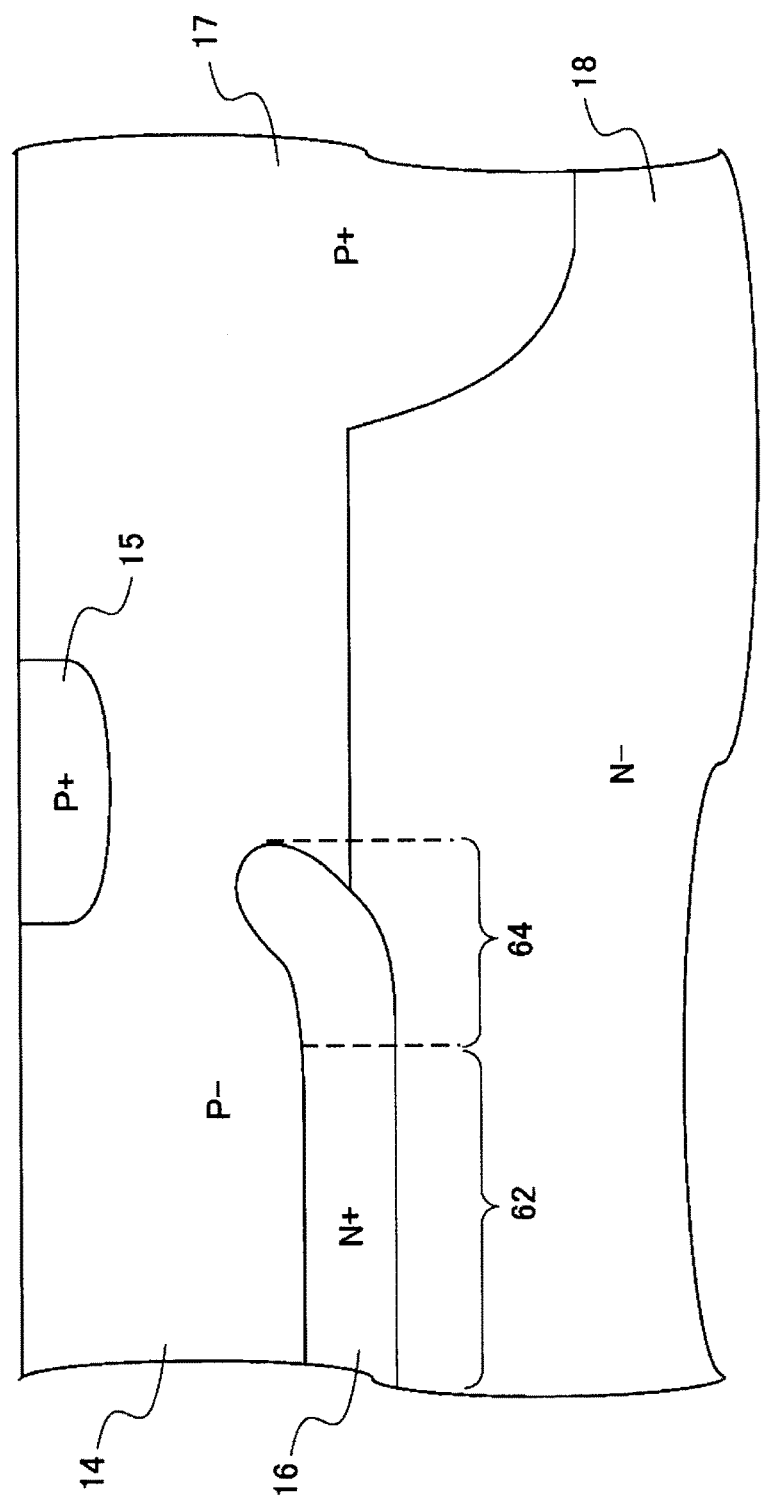
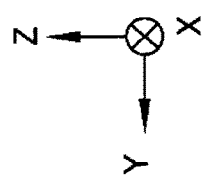
FIG.9

SEMICONDUCTOR DEVICE WITH IMPROVED CURRENT FLOW DISTRIBUTION

The contents of the following Japanese patent applications are incorporated herein by reference:
NO. 2016-203146 filed in JP on Oct. 14, 2016, and
NO. 2017-091414 filed in JP on May 1, 2017.

BACKGROUND

1. Technical Field

The present invention relates to a semiconductor device.

2. Related Art

Conventionally, semiconductor devices in which a transistor section such as an IGBT (Insulated Gate Bipolar Transistor) and a diode section such as an FWD (Free Wheeling Diode) are formed within a single chip are known. In the semiconductor device, an $N^+$-type cathode region is provided in a region which is on the lower-surface side of the chip and where the diode section is provided (see Patent Document 1, for example).

Patent Document 1: Japanese Patent Application Publication No. 2015-135954

In the diode section, a contact portion is provided along a trench longitudinal direction, for example. There is a problem that, if an $N^+$-type cathode region is provided in the entire lower portion of the diode section, currents flowing from the lower surface of the chip toward its upper surface are concentrated at an end portion of the diode section, i.e. an end portion of the contact portion.

SUMMARY

In a first aspect of the present invention, a semiconductor device is provided. The semiconductor device may include a semiconductor substrate, a transistor section, and a diode section. The transistor section and the diode section may be provided in the semiconductor substrate. The diode section may be adjacent to the transistor section. The diode section may include a second conductivity-type anode region, a first conductivity-type drift region, a first conductivity-type cathode region, a plurality of dummy trench portions, a contact portion, and a lower-surface side semiconductor region. The second conductivity-type anode region may be at least partially exposed on the upper surface of the semiconductor substrate. The first conductivity-type drift region may be provided below the anode region. The first conductivity-type cathode region may be provided below the drift region. The plurality of dummy trench portions may penetrate at least the anode region. The plurality of dummy trench portions may be arrayed along a predetermined array direction. The contact portion may be provided along an extending direction of the plurality of dummy trench portions that is different from the array direction. The lower-surface side semiconductor region may be provided below the drift region. The lower-surface side semiconductor region may be provided directly below a portion of the contact portion at an outer end in the extending direction.

The transistor section may include a first conductivity-type emitter region, a second conductivity-type base region, a first conductivity-type drift region, a plurality of gate trench portions, a first conductivity-type accumulation region, and the lower-surface side semiconductor region. The first conductivity-type emitter region may be exposed on the upper surface of the semiconductor substrate. The second conductivity-type base region may be at least partially provided below the emitter region. The first conductivity-type drift region may be provided below the base region. The plurality of gate trench portions may penetrate at least the base region. The plurality of gate trench portions may extend in the extending direction. The first conductivity-type accumulation region may be provided between the base region and the drift region in the transistor section, and between the anode region and the drift region in the diode section. The first conductivity-type accumulation region may have a higher first conductivity-type doping concentration than the drift region. The lower-surface side semiconductor region may be provided below the drift region. The lower-surface side semiconductor region may also be provided directly below a portion of the accumulation region in the diode section, the portion being at an outer end in the extending direction.

A portion of the accumulation region at an outer end in the extending direction may be provided on an inner side relative to a portion of the contact portion at an outer end in the extending direction. The lower-surface side semiconductor region may be provided continuously at least from a position directly below a portion of the contact portion at an outer end in the extending direction to a position directly below a portion of the accumulation region at an end in the extending direction.

A length from a portion of the lower-surface side semiconductor region at an end in the extending direction to a portion of the accumulation region at an outer end in the extending direction may be greater than a length from a portion of the accumulation region at an outer end in the extending direction to a portion of the contact portion at an outer end in the extending direction.

Instead, a length from a portion of the lower-surface side semiconductor region at an end in the extending direction to a portion of the accumulation region at an outer end in the extending direction may be less than a length from a portion of the accumulation region at an outer end in the extending direction to a portion of the contact portion at an outer end in the extending direction.

The lower-surface side semiconductor region may be provided continuously to a position 200 μm or more inner from a portion of the accumulation region at an outer end in the extending direction.

A portion of the accumulation region at an outer end in the extending direction may be provided on an inner side relative to a portion of the contact portion at an outer end in the extending direction. The lower-surface side semiconductor region may be provided continuously at least from a position directly below a portion of the contact portion at an outer end in the extending direction to a position at an outer side relative to a position directly below a portion of the accumulation region at an end in the extending direction.

A region of the accumulation region at an end in the extending direction is provided such that a depth of the region at a more outer side is shallower.

The diode section may include, between the plurality of dummy trench portions, a high-concentration second conductivity-type region and a high-concentration first conductivity-type region. The high-concentration second conductivity-type region may have a higher second conductivity-type doping concentration than the anode region. The high-concentration first conductivity-type region may have a higher first conductivity-type doping concentration than the drift region.

The high-concentration first conductivity-type region and the high-concentration second conductivity-type region may extend in the extending direction. The high-concentration first conductivity-type region and the high-concentration second conductivity-type region may be adjacent to each other in the array direction.

Also, the high-concentration first conductivity-type region and the high-concentration second conductivity-type region may extend in the array direction. In this case, the high-concentration first conductivity-type region and the high-concentration second conductivity-type region may be adjacent to each other in the extending direction.

The transistor section may include a plurality of gate trench portions. The plurality of gate trench portions may include a first portion and a second portion. The first portion may extend along the extending direction. The second portion may extend in the array direction. The second portion may be connected to portions of a plurality of the first portions at an end in the extending direction. The second portion may be connected to portions of three or more of the first portions at an end in the extending direction.

The plurality of dummy trench portions in the diode section may include a first portion and a second portion. The first portion may extend along the extending direction. The second portion may extend in the array direction. The second portion may be connected to portions of a plurality of the first portions at an end in extending direction. The second portion may be connected to portions of three or more of the first portions at an end in the extending direction.

The first portion of the plurality of gate trench portions and the first portion of the plurality of dummy trench portions may be parallel to each other. Instead, the first portion of the plurality of gate trench portions and the first portion of the plurality of dummy trench portions may be orthogonal to each other.

The diode section may include a lifetime killer region. The lifetime killer region may extend to an outer side of the diode section relative to the first portion of the plurality of dummy trench portions. Also, the lifetime killer region may extend to an outer side of the diode section relative to the second portion of the plurality of dummy trench portions. The lifetime killer region may extend to an outer side relative to the second portion of the plurality of gate trench portions.

Each of the plurality of gate trench portions may include a gate conductive portion. The gate conductive portion may be provided in contact with a gate insulating film and on an inner side of each of the plurality of gate trench portions relative to the gate insulating film. The semiconductor device may further include a gate metal layer. The gate metal layer may be provided outside the transistor section or the diode section in top view of the semiconductor substrate and may be electrically connected to the gate conductive portion. The lifetime killer region may extend outside the gate metal layer.

A depth from the upper surface of the semiconductor substrate to the lifetime killer region may be less than a depth from the lifetime killer region to a lower surface of the semiconductor substrate.

The summary clause does not necessarily describe all necessary features of the embodiments of the present invention. The present invention may also be a sub-combination of the features described above.

BRIEF DESCRIPTION OF THE DRAWINGS

FIG. 9 is an enlarged partial view of the accumulation region 16 near the contact region 15 in FIG. 8.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
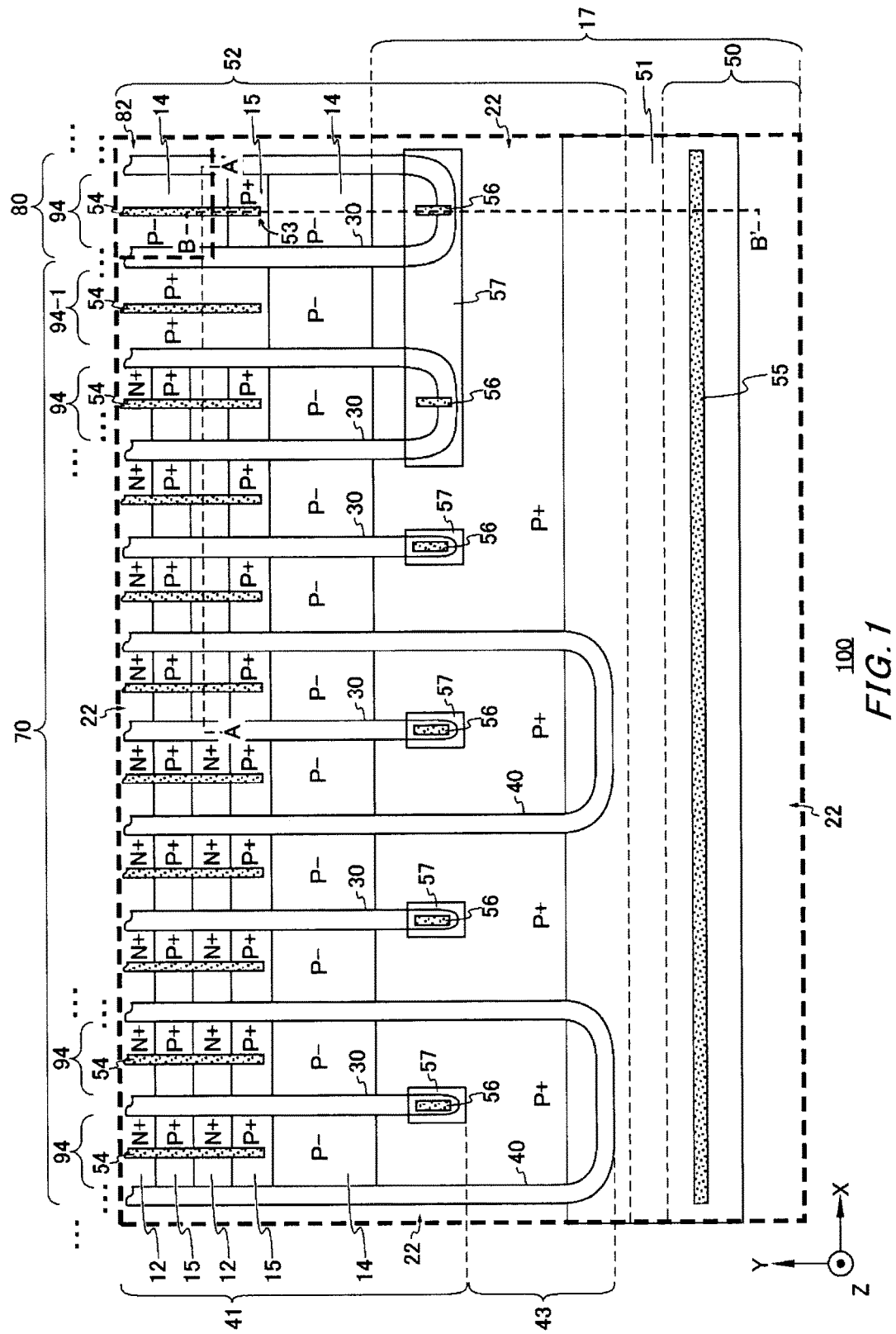
FIG. 1 is a top view of a semiconductor device 100 according to a first embodiment.

FIG. 1 is a top view of a semiconductor device 100 according to a first embodiment. The semiconductor device 100 of the present example has a semiconductor substrate including: a transistor section 70 including a transistor such as an IGBT; and a diode section 80 including a diode such as an FWD. In the upper surface of the semiconductor substrate, the diode section 80 is provided adjacent to the transistor section 70. The upper surface of the semiconductor substrate refers to one of two opposing principal surfaces of the semiconductor substrate. FIG. 1 shows a part of the upper surface around an end portion of the semiconductor substrate, and other regions are omitted. Note that, a collector region 22 and a cathode region 82 indicated with arrows in FIG. 1 are provided on the back-surface side of the semiconductor substrate.

In the present example, the transistor section 70 and the diode section 80 are provided in an active region of the semiconductor substrate. In the present example, the transistor section 70 is an imaginary projection region where the collector region 22 is imaginarily projected from the back-surface side of the semiconductor substrate toward its front-surface side in a direction perpendicular to the back surface of the semiconductor substrate, and includes a region in which predetermined unit structures including both an emitter region 12 and a contact region 15 are regularly arranged. Also, in the present example, the diode section 80 includes a back-surface region coinciding with the cathode region 82, or includes an imaginary projection region where the cathode region 82 is imaginarily projected from the back-surface side of the semiconductor substrate toward its front-surface side in a direction perpendicular to the back surface of the semiconductor substrate.

As used herein, directions indicated by the terms "upper", "lower", "above", "below", "upper surface" and "lower surface" are not limited to upper and lower directions in the gravitational direction. These terms refer to relative directions along a predetermined axis.

FIG. 1 shows an active region around an end portion of the semiconductor substrate. Note that, the semiconductor device 100 may have an edge termination section that surrounds the active region as seen from top. The active region refers to a region in which currents flow when the semiconductor device 100 is controlled to be in the ON state. The edge termination section relieves electric field concentration on the upper-surface side of the semiconductor substrate. The edge termination section has, for example, a guard ring, a field plate, a RESURF, and a combination structure thereof.

The semiconductor device 100 of the present example includes dummy trench portions 30, gate trench portions 40, emitter regions 12, base regions 14, contact regions 15, and a well region 17, formed on the upper-surface side of the semiconductor substrate. Note that, in this specification, the gate trench portions 40 and the dummy trench portions 30 may be collectively referred to as trench portions. The semiconductor device 100 of the present example also includes an emitter electrode 52 and a gate metal layer 50 provided above the upper surface of the semiconductor substrate. The emitter electrode 52 and the gate metal layer 50 are provided being separated from each other.

The semiconductor device 100 has an interlayer insulating film between each of the emitter electrode 52 and the gate metal layer 50 and the upper surface of the semiconductor substrate. The interlayer insulating film is omitted in FIG. 1. The interlayer insulating film of the present example has contact holes 54, 55 and 56. The contact holes 54, 55 and 56 are formed penetrating the interlayer insulating film.

The emitter electrode 52 contacts the emitter regions 12, the contact regions 15 and the base regions 14 through contact holes 54. The emitter electrode 52 is also electrically connected to dummy conductive portions in the dummy trench portions 30 through contact holes 56. Conductive connecting portions 57 may be provided between the emitter electrode 52 and the dummy conductive portions. The connecting portions 57 may be formed of polysilicon doped with impurities or the like.

The gate metal layer 50 contacts a gate runner 51 through a contact hole 55. The gate runner 51 may be formed of polysilicon doped with impurities or the like. The conductive gate runner 51 is provided between the gate metal layer 50 and the gate conductive portions in the gate trench portions 40. The gate runner 51 is provided, in the upper surface of the semiconductor substrate, at least between portions of the gate trench portions 40 and the contact hole 55. The gate runner 51 is electrically connected to the gate conductive portions in the gate trench portions 40.

The emitter electrode 52 and the gate metal layer 50 are formed of a metal-containing material. For example, at least a partial region of each electrode is formed of aluminum or an aluminum-silicon alloy. Each electrode may have a barrier metal formed of titanium, a titanium compound or the like as an underlying layer of a region formed of aluminum or the like, and may have a plug formed of tungsten or the like in the contact holes 54, 55 and 56.

A plurality of gate trench portions 40 and a plurality of dummy trench portions 30 are arrayed being spaced at a predetermined interval along a predetermined array direction in regions of the transistor section 70. In the transistor section 70, one or more gate trench portions 40 and one or more dummy trench portions 30 may be provided alternately along the array direction. In the diode section 80, a plurality of dummy trench portions 30 are arrayed being spaced at a predetermined interval along the array direction.

In the present example, dummy trench portions 30 having two types of shape are provided in the upper surface of the semiconductor substrate. The first type of shape is a linear shape extending in a predetermined extending direction. The second type of shape is a U-shape, in which linear portions extending in the extending direction and a linear portion extending in the array direction are connected by curved portions at their end portions.

In FIG. 1, the array direction of the trench portions is the X-axis direction. The extending direction of the trench portions is the Y-axis direction. The X-axis and the Y-axis are axes orthogonal to each other in a plane parallel to the upper surface of the semiconductor substrate. The Z-axis is an axis orthogonal to the X-axis and the Y-axis. As used herein, the Z-axis direction may be referred to as a depth direction.

In the transistor section 70, a plurality of dummy trench portions 30 may be arrayed being spaced at a predetermined interval at the boundary with the diode section 80. The number of dummy trench portions 30 arrayed in the X-axis direction near the boundary between the transistor section 70 and the diode section 80 may be greater than the number of dummy trench portions 30 arrayed on an inner side of the transistor section 70 away from the diode section 80.

In the example of FIG. 1, in a part of the transistor section 70 at the boundary between the transistor section 70 and the diode section 80, three dummy trench portions 30, two of which are connected in a U-shape and the other one has a linear shape, are arrayed being spaced at a predetermined interval. Note that, a dummy trench portion 30 overlapping the boundary between the transistor section 70 and the diode section 80 is not counted as one in the three described above. In contrast, in a part of the transistor section 70 away from the boundary between the transistor section 70 and the diode section 80, gate trench portions 40 and dummy trench portions 30 are arrayed alternately one by one. Note that, in FIG. 1, the diode section 80 includes two dummy trench portions 30 connected in a U-shape. However, the diode section 80 may further include a plurality of dummy trench portions 30 in the positive X-axis direction.

In the present example, gate trench portions 40 having a single type of shape are provided in the upper surface of the semiconductor substrate. The shape is a U-shape, in which linear portions extending in a predetermined extending direction and a linear portion extending in the array direction are connected by curved portions at their end portions.

A gate trench portion 40 has an opposing portion 41 and a protruding portion 43. The opposing portion 41 is a portion opposing a dummy trench portion 30 in the transistor section 70. The opposing portion 41 is provided in parallel with a dummy trench portion 30. The protruding portion 43 is provided on an outer side in the Y-axis direction relative to the opposing portion 41. Note that, in the present example, an outer side in the Y-axis direction refers to an end portion side of the semiconductor substrate near the gate metal layer 50. An inner side in the Y-axis direction refers to the opposite side to the outer side. In the present example, two opposing portions 41 of a gate trench portion 40 provided on both sides of a dummy trench portion 30 are connected to one protruding portion 43. At least a part of the protruding portion 43 may have a curved shape.

In the protruding portion 43, a gate conductive portion in a gate trench portion 40 and the gate runner 51 are electrically connected. The gate runner 51 may be electrically connected to a gate conductive portion in a region of the protruding portion 43 most away from the opposing portions 41. The protruding portion 43 of the present example has a portion extending in the array direction in a region most away from the opposing portions 41. The gate runner 51 may be connected to a gate conductive portion in that portion of the protruding portion 43.

A dummy trench portion 30 in the diode section 80 may have a similar shape to a dummy trench portion 30 in the transistor section 70, or may have a similar shape to a gate trench portion 40 in the transistor section 70. A dummy trench portion 30 in the diode section 80 has the same length as a dummy trench portion 30 in the transistor section 70.

The emitter electrode 52 is provided above the gate trench portions 40, the dummy trench portions 30, the well region 17, the emitter regions 12, the base regions 14 and the contact regions 15. The well region 17 is formed from the end portion of the active region at which the gate metal layer 50 is provided to a predetermined extent in the positive Y-axis direction. The diffusion depth of the well region 17 may be greater than the depths of the dummy trench portions 30 and the gate trench portions 40. Partial regions of the dummy trench portions 30 and the gate trench portions 40 positioned on the gate metal layer 50 side are formed in the well region 17. The bottom portions of extending direction ends of the dummy trench portions 30 and the gate trench portions 40 may be provided in the well region 17.

The protruding portions 43 of the gate trench portions 40 may be provided in the well region 17 in their entirety. The semiconductor substrate is of a first conductivity-type, and the well region 17 is of a second conductivity-type that is different from the semiconductor substrate. In the present example, the semiconductor substrate is of $N^-$-type, and the well region 17 is of $P^+$-type. The present example is described assuming that the first conductivity-type is N-type and the second conductivity-type is P-type. However, in another example, the first conductivity-type may be P-type, and the second conductivity-type may be N-type.

In the present example, mesa portions 94 are parts of the semiconductor substrate positioned closer to the front surface of the semiconductor substrate than the bottom surfaces of the dummy trench portions 30 and the gate trench portions 40. The mesa portions 94 are also regions sandwiched between trench portions. Base regions 14 are provided in the mesa portions 94. The base regions 14 are of the second conductivity-type and have a lower doping concentration than the well region 17. The base regions 14 of the present example are of $P^-$-type. At least parts of the base regions 14 are provided below the emitter regions 12 and the contact regions 15.

In the mesa portions 94, second conductivity-type contact regions 15 having a higher doping concentration than the base regions 14 are provided on the base regions 14. The contact regions 15 of the present example are of $P^+$-type. In the transistor section 70, first conductivity-type emitter regions 12 having a higher doping concentration than the semiconductor substrate are selectively formed in regions other than the contact regions 15. The emitter regions 12 of the present example are of $N^+$-type.

Each of the contact regions 15 and the emitter regions 12 is formed from one of two trench portions adjacent in the X-axis direction to the other of the trench portions. In the transistor section 70, one or more contact regions 15 and one or more emitter regions 12 are exposed on the upper surface of a mesa portion 94 alternately along the extending direction of the trench portions.

A mesa portion 94 in the diode section 80 has a contact region 15 at the same Y-axis direction position as at least one contact region 15 in the transistor section 70. In the example of FIG. 1, a mesa portion 94 in the diode section 80 has a contact region 15 at the same Y-axis direction position as the contact region 15 closest to the gate metal layer 50 in the transistor section 70. The mesa portion 94 in the diode section 80 has a base region 14 in a region other than the contact region 15.

In the transistor section 70, a contact hole 54 is provided above each region of contact regions 15 and emitter regions 12 provided being arranged side by side in the Y-axis direction. In the transistor section 70, a contact hole 54 is not provided above the base regions 14 and the well region 17. In the diode section 80, a contact hole 54 is provided above the base region 14 and the contact region 15. In the diode section 80 as well, a contact hole 54 is not provided above the well region 17 and above the base region 14 closest to the gate metal layer 50. In the present example, contact holes 54 in the transistor section 70 and a contact hole 54 in the diode section 80 have the same length in the extending direction of each trench portion. The contact structure provided inside a contact hole 54 of the present example is one example of the contact portion provided along the Y-axis direction. The contact structure may be the emitter electrode 52 in direct contact with the semiconductor substrate, or may be the plug described above.

Note that, at least one boundary mesa portion 94-1 that is among a plurality of mesa portions 94 and is near the boundary between the transistor section 70 and the diode section 80 has a contact region 15. In the present example, the area of the contact region 15 exposed on the upper surface of the semiconductor substrate in the boundary mesa portion 94-1 is greater than the area of a contact region 15 exposed on the upper surface of the semiconductor substrate in another mesa portion 94. Note that, the boundary mesa portion 94-1 of the present example refers to a mesa portion 94 that is among mesa portions 94 adjacent to a dummy trench portion 30 overlapping the boundary between the transistor section 70 and the diode section 80 and is closer to the transistor section 70.

In the example of FIG. 1, the boundary mesa portion 94-1 is adjacent to the boundary between the transistor section 70 and the diode section 80. In the boundary mesa portion 94-1, the contact region 15 is also provided in a region in which an emitter region 12 is provided in another mesa portion 94 of the transistor section 70. That is, the boundary mesa portion 94-1 of the present example does not have an emitter region 12 in the upper surface of the semiconductor substrate.

At least a part of the mesa portion 94 in the diode section 80 has a base region 14 exposed on the upper surface of the semiconductor substrate. The mesa portion 94 also has a base region 14 at the same Y-axis direction position as the contact region 15 in the boundary mesa portion 94-1. In the present example, the base region 14 in the diode section 80 functions as an anode region. That is, in the present example, the base region 14 in the diode section 80 may be regarded as an anode region.

A cathode region 82 is provided in a partial region of the diode section 80 that is below the base region 14 in the Z-axis direction. The cathode region 82 is of the first conductivity-type. The cathode region 82 of the present example is of $N^+$-type. The cathode region 82 of the present example is provided in a part directly below the base region 14. In FIG. 1, a region in which the cathode region 82 is provided is indicated by bold dashed line.

The diode section 80 of the present example has a collector region 22 in a region other than the cathode region 82 at the same depth position as the cathode region 82. The collector region 22 is of the second conductivity-type, and the collector region 22 of the present example is of $P^+$-type. In FIG. 1, a region in which the collector region 22 is provided is indicated by bold dashed line, similarly to the cathode region 82. The collector region 22 of the present example is one example of a second conductivity-type lower-surface side semiconductor region. The lower-surface side semiconductor region is of the second conductivity-type, and the lower-surface side semiconductor region of the present example is of $P^+$-type. The lower-surface side semiconductor region may have the same P-type doping concentration as the collector region 22, may have a higher P-type doping concentration than the collector region 22, or may have a P-type doping concentration that is lower than the collector region 22 and higher than the base regions 14. In the present example, a collector region 22 is provided in a region where the transistor section 70 is imaginarily projected to the lower-surface side of the semiconductor substrate. A collector region 22 may be provided in a region where the boundary mesa portion 94-1 is imaginarily projected to the lower-surface side of the semiconductor substrate, or the collector region 22 in the transistor section 70 may be provided extending thereto. In this case, the boundary mesa portion 94-1 may be a part of the transistor section 70.

Note that, the cathode region 82 and the collector region 22 are not limited only to the regions enclosed by the bold dashed line. For example, the bold dashed line for the cathode region 82 that is not the boundary with the collector region 22 merely indicates its ends in the drawing, and the cathode region 82 may be formed beyond the bold dashed line. The same applies for the collector region 22. On the other hand, with regard to the cathode region 82, the cathode region 82 is not formed beyond the dashed line indicating the boundary with the collector region 22.

The collector region 22 may be provided continuously across the transistor section 70 and the diode section 80. In the transistor section 70 of the present example, the collector region 22 is provided in the entire region on the lower-surface side of the semiconductor substrate. In contrast, in the diode section 80 of the present example, the collector region 22 is provided in a partial region on the lower-surface side of the semiconductor substrate. In the diode section 80, the collector region 22 may be provided directly below the well region 17, may be provided directly below the Y-axis direction end portion of the contact region 15, and may also be provided directly below the base region 14 adjacent to the contact region 15 in the positive Y-axis direction. In the diode section 80 of the present example, the collector region 22 is provided continuously from the Y-axis direction end portion of the semiconductor substrate to a position directly below the base region 14.

Thus, in the present example, the cathode region 82 is not provided directly below the contact region 15 of the diode section 80. In the present example, the cathode region 82 is scaled down in the positive Y-axis direction, and accordingly, the collector region 22 is scaled up in the positive Y-axis direction. In this manner, the collector region 22 is provided at least directly below the Y-axis direction outer end portion 53 of the contact hole 54. The collector region 22 is provided further beyond the end portion 53 in the positive Y-axis direction. As described above, a contact portion is provided in the contact hole 54, and the end portion of the contact portion coincides with the end portion 53 of the contact hole 54. In the present example, concentration of currents flowing from the lower surface of the semiconductor substrate toward its upper surface, at the end portion 53 of the contact portion can be suppressed.

Figure 2:
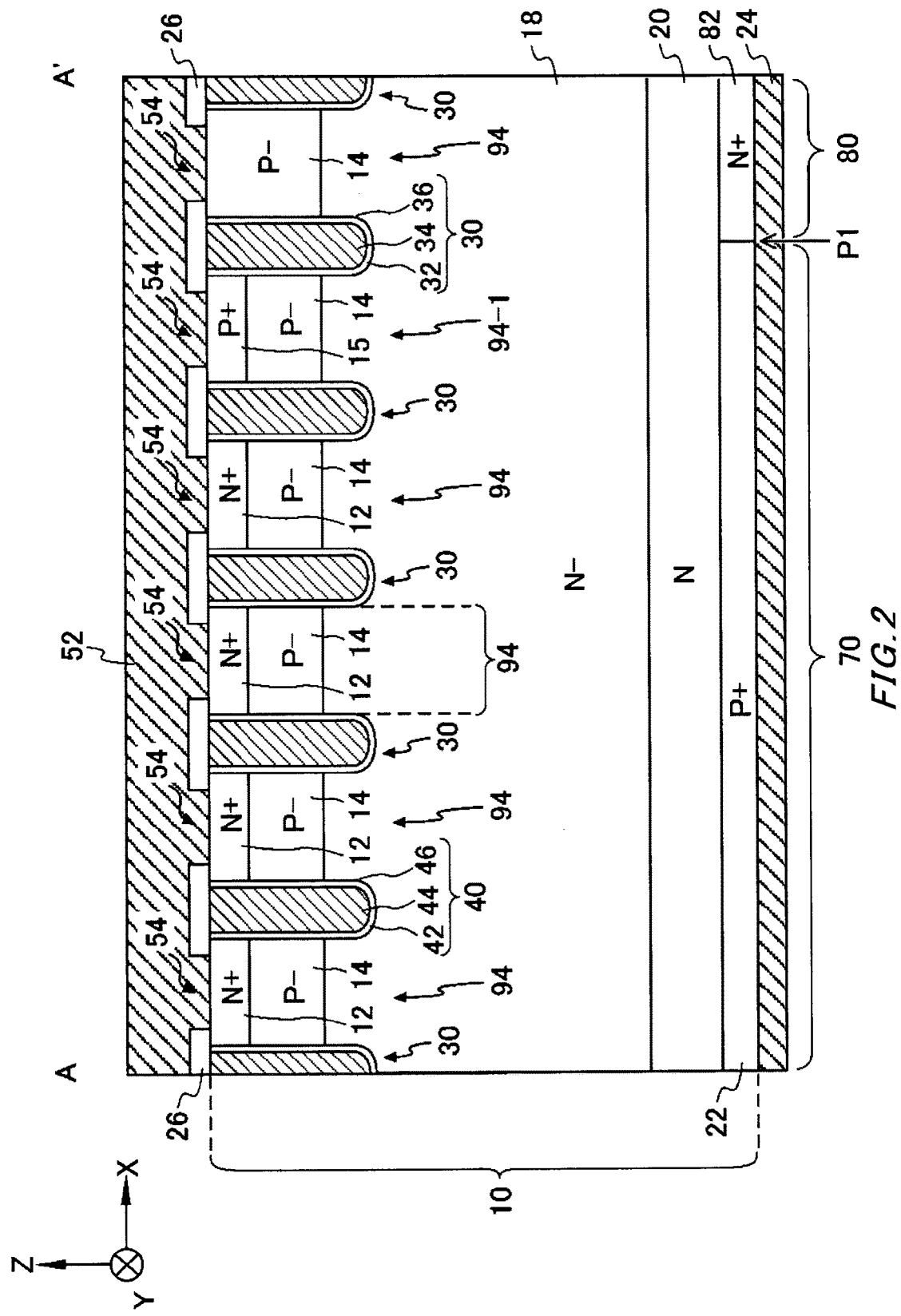
FIG. 2 is a cross-sectional view taken along A-A' in FIG. 1.

FIG. 2 is a cross-sectional view taken along A-A' in FIG. 1. The A-A' cross section is a cross section parallel to the X-Z plane. The A-A' cross section passes through emitter regions 12 in the transistor section 70 and a base region 14 in the diode section 80. The semiconductor device 100 of the present example includes, in the A-A' cross section, a semiconductor substrate 10, an interlayer insulating film 26, an emitter electrode 52 and a collector electrode 24. The emitter electrode 52 is formed on the upper surfaces of the semiconductor substrate 10 and the interlayer insulating film 26.

In contrast, the collector electrode 24 is formed on the lower surface of the semiconductor substrate 10. The lower surface refers to the surface on the opposite side of the upper surface. The emitter electrode 52 and the collector electrode 24 are formed of a conductive material such as metal. As used herein, a surface or end portion of each member such as a substrate, layer or region on the emitter electrode 52 side is referred to as an upper surface or upper end, and a surface or end portion thereof on the collector electrode 24 side is referred to as a lower surface or lower end. The direction connecting the emitter electrode 52 and the collector electrode 24 is referred to as a depth direction.

The semiconductor substrate 10 may be a silicon substrate, may be a silicon carbide substrate, or may be a nitride semiconductor substrate such as gallium nitride or the like. In the A-A' cross section, on the upper-surface side of each mesa portion 94 in the transistor section 70, an $N^+$-type emitter region 12 and a $P^-$-type base region 14 are provided in this order from the upper-surface side of the semiconductor substrate 10. In the A-A' cross section, on the upper-surface side of each mesa portion 94 in the diode section 80, a $P^-$-type base region 14 is provided.

In the transistor section 70 and the diode section 80, a first conductivity-type drift region 18 is provided below base regions 14. The drift region 18 of the present example is of $N^-$-type. In the transistor section 70 and the diode section 80, an N-type buffer region 20 is provided below the drift region 18. The doping concentration of the buffer region 20 may be higher than the doping concentration of the drift region 18. The buffer region 20 may function as a field stop layer that prevents the depletion layer expanding from the lower-surface side of base regions 14 from reaching the $P^+$-type collector region 22 and the $N^+$-type cathode region 82.

In the transistor section 70, a P+-type collector region 22 is provided below the buffer region 20. In the diode section 80, an N+-type cathode region 82 is provided below the buffer region 20. Also, a collector electrode 24 is provided on the lower surface of collector region 22 and the cathode region 82.

In this specification, the boundary between the transistor section 70 and the diode section 80 is a plane that passes through the boundary between the collector region 22 and the cathode region 82 and is parallel to the Y-Z plane. The boundary P1 between the collector region 22 and the cathode region 82 may be at a position where the net doping concentration distribution of dopant in the X-axis direction assumes a local minimum value. One dummy trench portion 30 may be formed on a region including the boundary P1 between the transistor section 70 and the diode section 80. In the X-axis direction, the position of the boundary P1 between the transistor section 70 and the diode section 80 may also be the position of the dummy trench portion 30 closest to a position where the net doping concentration assumes a local minimum value.

One or more gate trench portions 40 and one or more dummy trench portions 30 are provided on the upper-surface side of the semiconductor substrate 10. Each trench portion may penetrate a base region 14 from the upper surface of the semiconductor substrate 10 to reach the drift region 18. Each trench portion may also penetrate one or more regions of an emitter region 12, a base region 14 and a contact region 15 to reach the drift region 18. In the A-A' cross section, the shape of the bottom portions of the trench portions may be a U-shape.

In the present example, a gate trench portion 40 has a gate insulating film 42, a gate conductive portion 44 and a gate trench 46. The gate insulating film 42 may be provided covering the inner wall of the gate trench 46. The gate insulating film 42 may be formed by oxidizing or nitriding the semiconductor of the inner wall of the gate trench 46. The gate conductive portion 44 of the present example is provided on an inner side relative to the gate insulating film 42 inside the gate trench. The gate insulating film 42 may insulate the gate conductive portion 44 from the semiconductor substrate 10. The gate conductive portion 44 may be formed of a conductive material such as polysilicon.

In the present example, a gate trench portion 40 is covered by an interlayer insulating film 26 in the upper surface of the semiconductor substrate 10. In the present example, as shown in FIG. 1, the gate conductive portion 44 in a protruding portion 43 is electrically connected to the gate metal layer 50 through the gate runner 51. When a predetermined voltage is applied to the gate conductive portion 44, a channel is formed in a region of the base region 14 near the interface in contact with the gate trench 46.

A dummy trench portion 30 may have the same structure as a gate trench portion 40, in the A-A' cross section. A dummy trench portion 30 has a dummy insulating film 32, a dummy conductive portion 34 and a dummy trench 36, formed on the upper-surface side of the semiconductor substrate 10. The dummy insulating film 32 is formed covering the inner wall of the dummy trench 36. The dummy conductive portion 34 is provided on an inner side relative to the dummy insulating film 32 inside the dummy trench 36. The dummy insulating film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length in the depth direction as the gate conductive portion 44.

In the present example, a dummy trench portion 30 is covered by an interlayer insulating film 26 in the upper surface of the semiconductor substrate 10. In the present example, as shown in FIG. 1, the dummy conductive portion 34 is electrically connected to the emitter electrode 52 through the contact hole 56.

In the present example, in the boundary mesa portion 94-1 that is among a plurality of mesa portions 94 and is at the boundary between the transistor section 70 and the diode section 80, an emitter region 12 exposed on the upper surface of the semiconductor substrate 10 is not provided, and a contact region 15 exposed on the upper surface of the semiconductor substrate 10 is provided. The boundary mesa portion 94-1 of the present example is a region into which electrons are not injected from the gate, i.e. a region that does not function as the IGBT, and therefore an emitter region 12 exposed on the upper surface of the semiconductor substrate 10 is preferably not provided in the entire boundary mesa portion 94-1, as shown in FIG. 1. The contact region 15 in the boundary mesa portion 94-1 of the present example is connected to the emitter electrode 52 through the contact hole 54.

In the present example, by providing the boundary mesa portion 94-1 described above, holes near the boundary between the transistor section 70 and the diode section 80 can be extracted efficiently when turning off the semiconductor device 100. In this manner, tail currents generated when turning off can be reduced efficiently, reducing the turn-off loss. Also, reduction of the breakdown withstand capability of the semiconductor device 100 can be suppressed. Furthermore, inflow of holes accumulated in the transistor section 70 into the diode section 80 can be suppressed, and the effect of interference from the transistor section 70 to the diode section 80 can be reduced.

Figure 3:
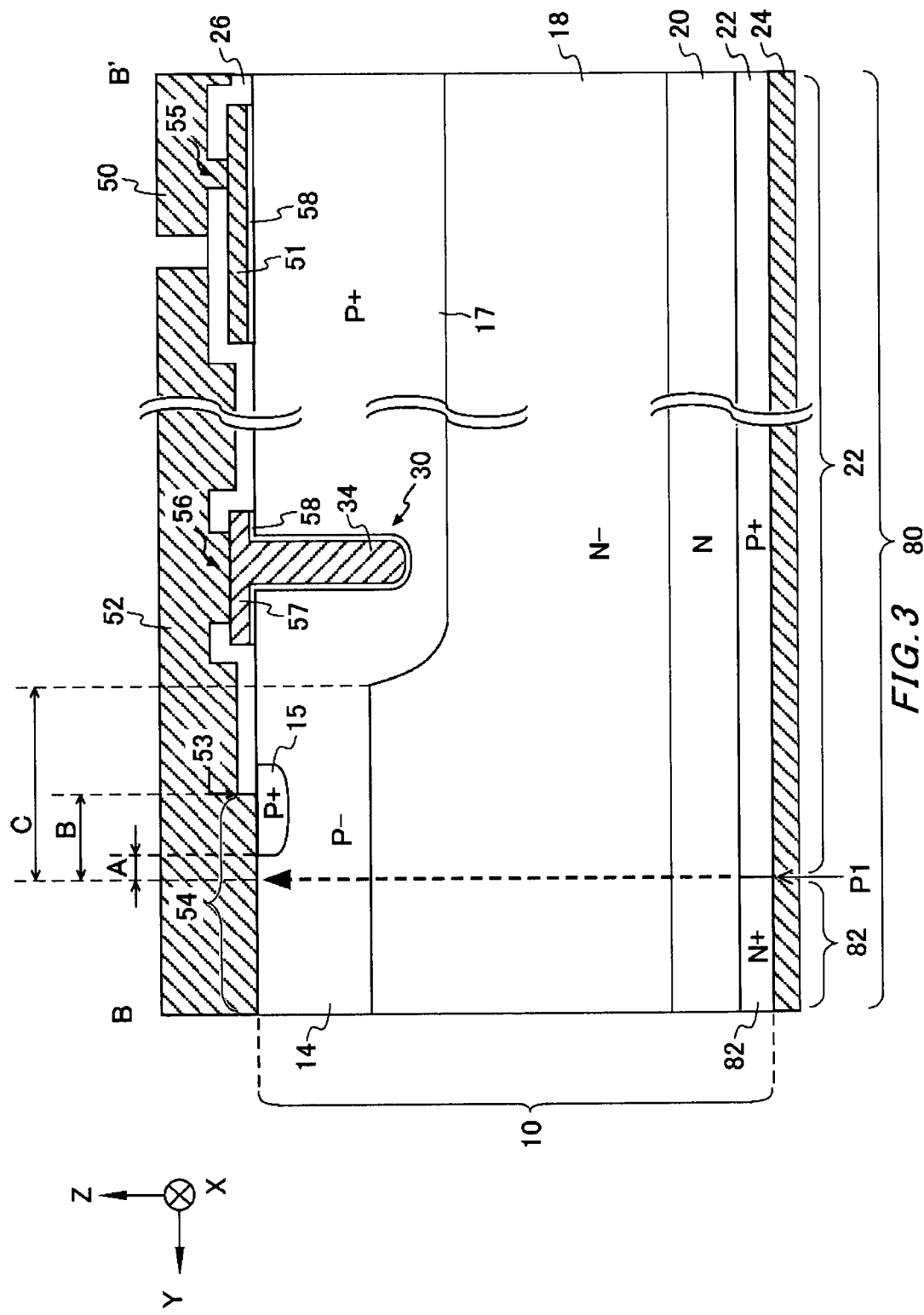
FIG. 3 is a cross-sectional view taken along B-B' in FIG. 1.

FIG. 3 is a cross-sectional view taken along B-B' in FIG. 1. The B-B' cross section is a plane parallel to the Y-Z plane. The B-B' cross section passes through a connecting portion 57 in the mesa portion 94 of the diode section 80. As described above, on the lower-surface side in the diode section 80 of the present example, a collector region 22 as a lower surface semiconductor region is provided. The collector region 22 of the present example extends beyond the well region 17 and the contact region 15 in the positive Y-axis direction. In the present example, the positive Y-axis direction end portion P1 of the collector region 22 is positioned beyond the end portion 53 of the contact hole 54 in the positive Y-axis direction (see the dashed arrow). A length A from the position where the positive Y-axis direction end portion P1 of the collector region 22 is imaginarily projected to the upper surface to the contact region 15 may be greater than the depth of the base region 14, and may be greater than the depth direction length from the base region 14 to the collector region 22. In the present example, the length is 100 μm.

A length B from the position where the positive Y-axis direction end portion P1 of the collector region 22 is imaginarily projected to the upper surface to the positive Y-axis direction end portion 53 of the contact hole 54 may be greater than the depth of the base region 14, and may be greater than the length in a direction from the bottom portion of the base region 14 to the top of the collector region 22. In the present example, the length B is 120 μm. Note that the depth of the base region 14 refers to a length from the upper surface to the bottom portion of the base region 14 measured in a direction in parallel with the Z-axis direction.

The length C from the position where the positive Y-axis direction end portion P1 of the collector region 22 is imaginarily projected to the upper surface to the boundary between the base region 14 and the well region 17 may be greater than the depth of the base region 14, and may be greater than the length from the bottom portion of the base region 14 to the top of the collector region 22 in the depth direction. In the present example, the length C is 140 μm.

The connecting portion 57 may be electrically connected to the dummy conductive portion 34 of the dummy trench portion 30. In the present example, at the position where the connecting portion 57 and the dummy conductive portion 34 are overlapped in the Z-axis direction, the connecting portion 57 and the dummy conductive portion 34 contact each other. In the present example, at the position where the connecting portion 57 and the dummy conductive portion 34 are not overlapped in the Z-axis direction, an insulating film 58 is provided between the upper surface of the semiconductor substrate 10 and the connecting portion 57. The insulating film 58 may be formed of the same insulating film as the dummy insulating film 32. The insulating film 58 may be a silicon oxide film, or may be a silicon nitride film.

The gate metal layer 50 is electrically connected to the gate runner 51 through the contact hole 55. As described above, the gate runner 51 extends in the X-axis direction, and is electrically connected to gate conductive portions 44 in the transistor section 70. In the present example, an insulating film 58 is also provided between the gate runner 51 and the upper surface of the semiconductor substrate 10. However, as described above, an insulating film 58 is not provided at a position where the gate runner 51 and the gate conductive portion 44 are overlapped in the Z-direction, and the gate runner 51 contacts the gate conductive portion 44 at the position.

Note that, in FIG. 3, if the cathode region 82 is also provided at a position directly below the well region 17, currents directed from the cathode region 82 directly below the well region 17 toward the upper surface of the semiconductor substrate 10 cannot flow to the well region 17 because a contact region 15 is not present in the well region 17. Therefore, the currents directed from a position directly below the well region 17 toward the upper surface would be concentrated at the end portion 53 of the contact portion. In contrast, in the present example, a collector region 22 is provided at least directly below the end portion 53, and thereby the current concentration at the end portion 53 can be avoided.

Figure 4:
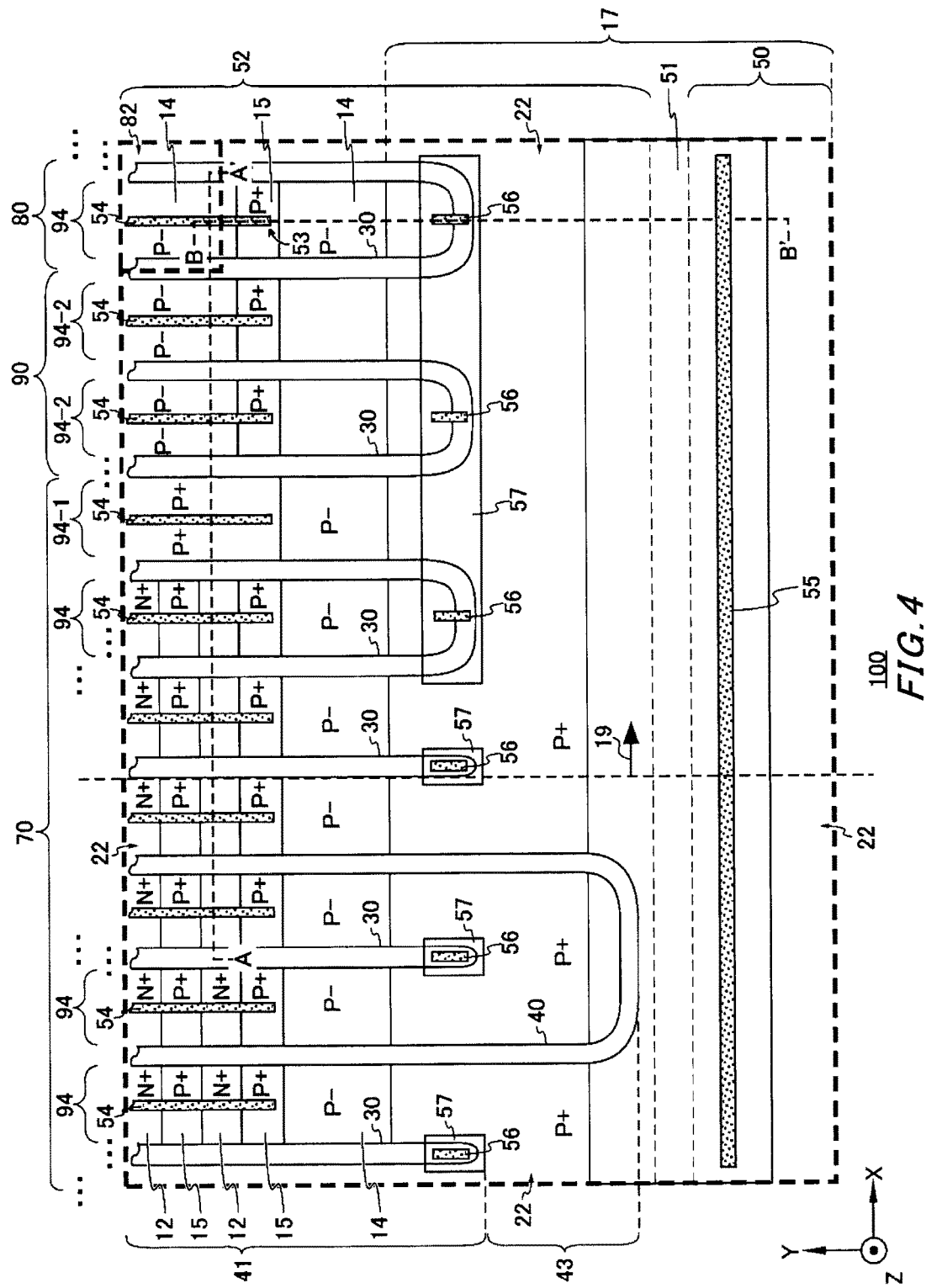
FIG. 4 is a variation of the first embodiment.

FIG. 4 is a variation of the first embodiment. The difference from FIG. 1 is that a boundary section 90 is additionally provided between the boundary mesa portion 94-1 and the diode section 80. Note that, the boundary mesa portion 94-1 of the present example refers to a mesa portion 94 that is among mesa portions 94 adjacent to the dummy trench portion 30 overlapping the boundary between the transistor section 70 and the boundary section 90 and is closer to the transistor section 70. The boundary section 90 of the present example includes a plurality of boundary mesa portions 94-2 having contact regions 15 only at both extending direction ends of contact holes 54. Between contact regions 15 at both extending direction ends, a base region 14 is exposed on the upper surface of the semiconductor substrate 10. In the upper surface of a boundary mesa portion 94-2, the area in which a base region 14 is exposed may be five times or more, ten times or more, or twenty times or more greater than the area of a contact region 15.

Also, the number of mesa portions 94 in the boundary section 90 may be greater than the number of mesa portions 94 in the boundary mesa portion 94-1, or may be the same as the number of mesa portions 94 in the boundary mesa portion 94-1. The number of mesa portions 94 refers to the number of mesa portions 94 sandwiched between trench portions in the array direction. In the present example, the number of mesa portions 94 in the boundary mesa portion 94-1 is one, and the number of mesa portions 94 of the boundary mesa portions 94-2 in the boundary section 90 is two.

A lifetime killer region 19 may be formed in a region ranging from a dummy trench portion 30 positioned beyond a gate trench portion 40 closest to the boundary section 90 in the positive X-axis direction and the entire region of the boundary section 90 and the diode section 80. The lifetime killer region 19 may be point defects (such as vacancies, divacancies and dangling bonds) formed inside the semiconductor substrate 10 by introducing light ion such as helium or metal such as platinum. Further, the lifetime killer region 19 may be carrier recombination centers formed by point defects.

Figure 5:
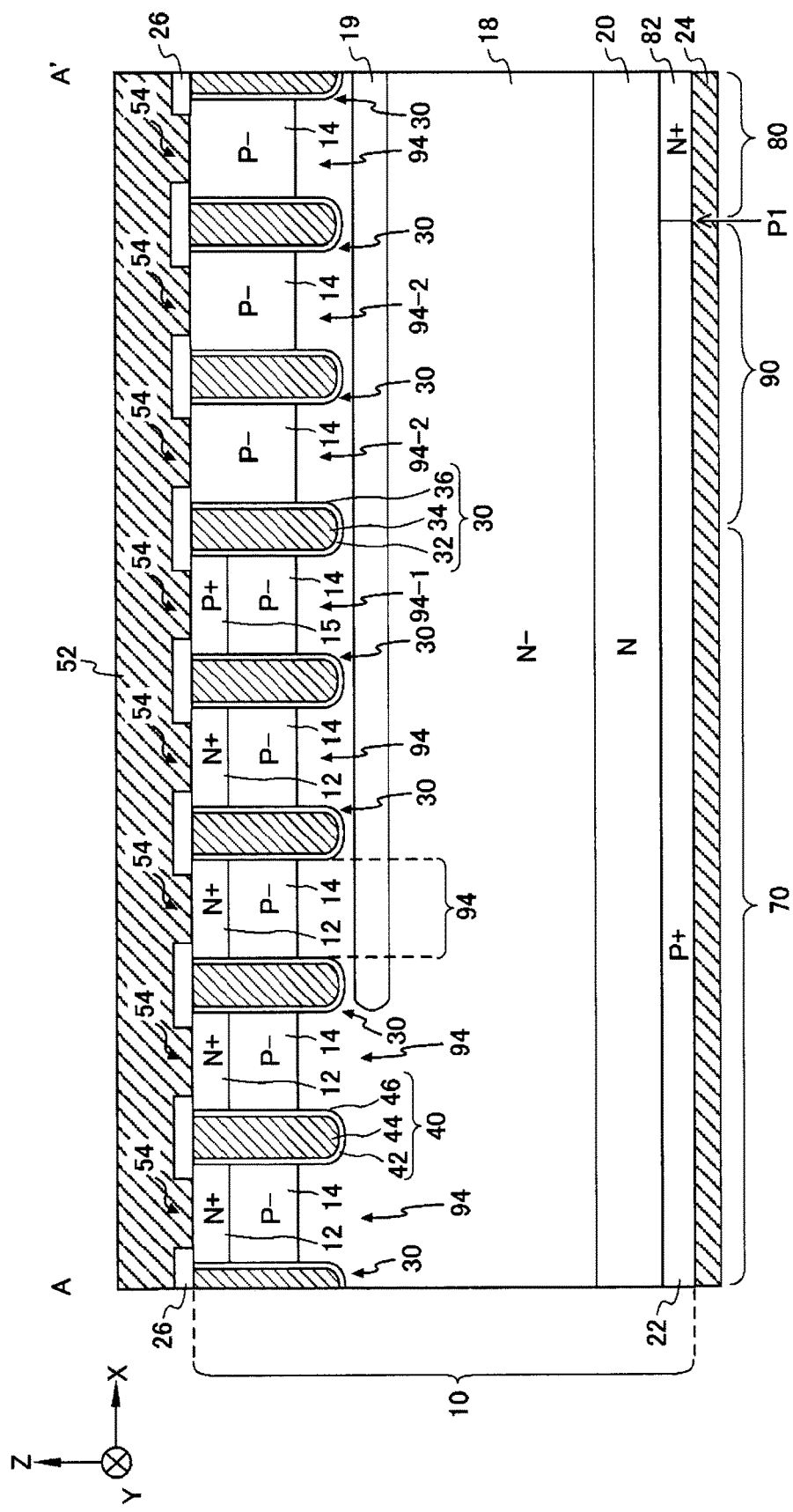
FIG. 5 is a cross-sectional view taken along A-A' in FIG. 4.

FIG. 5 is a cross-sectional view taken along A-A' in FIG. 4. The collector region 22 below the boundary mesa portion 94-1 may be formed extending to the lower surface of the semiconductor substrate 10 directly below the boundary mesa portions 94-2. When the diode section 80 is conducting in the forward direction, holes flow from the boundary mesa portion 94-1 in the transistor section 70 toward the cathode region 82 in the diode section 80. A contact region 15 is formed in substantially entire front surface of the boundary mesa portion 94-1, and therefore the injection amount of holes is large. In the present example, by providing boundary mesa portions 94-2 with a reduced area of the contact region 15 compared to the boundary mesa portion 94-1 in the boundary section 90, the distance between the boundary mesa portion 94-1 and the cathode region 82 is increased, and the injection amount of holes from the boundary mesa portion 94-1 can be reduced.

The lifetime killer region 19 shown in FIG. 5 may include a position at which the concentration of recombination centers of introduced helium or point defect carriers assumes its local maximum (peak). Also, the depth direction width of the lifetime killer region 19 shown in FIG. 5 may be a full width at half maximum of the peak concentration of introduced helium, point defects or recombination centers. In the lifetime killer region 19, the concentration distribution of the introduced helium, point defects or recombination centers may have a mountain-like distribution shape including a peak.

By providing the lifetime killer region 19, reverse recovery time can be reduced and the reverse recovery charge and reverse recovery peak current can be reduced when the diode section 80 is operated. Also, an excessive amount of minority carriers (holes in the present example) can be prevented from flowing from the mesa portion 94-1 into the diode section 80, and the reverse recovery withstand capability can be improved.

Figure 6:
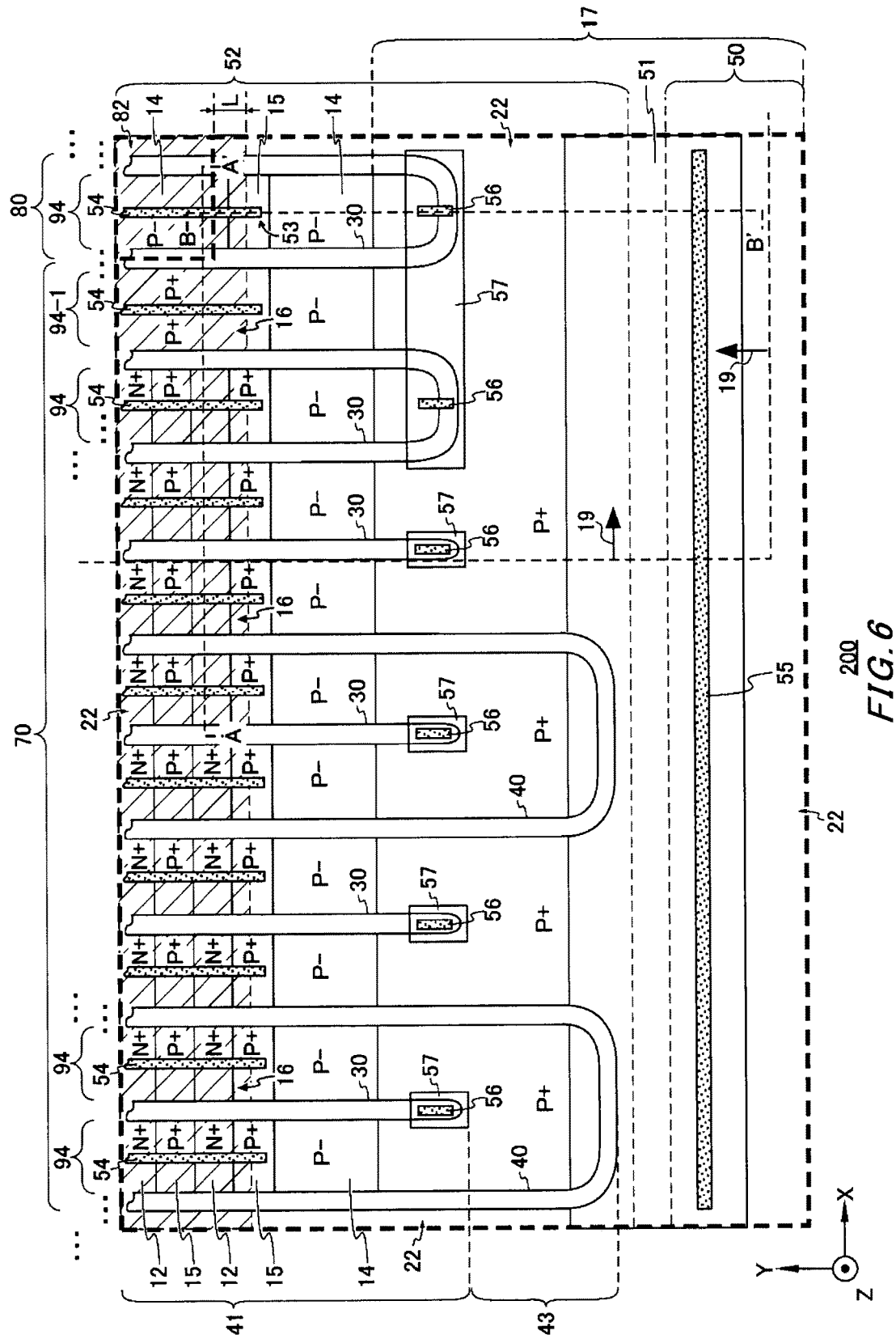
FIG. 6 is a top view of a semiconductor device 200 according to a second embodiment.

FIG. 6 is a top view of a semiconductor device 200 according to a second embodiment. The semiconductor device 200 of the present example includes first conductivity-type accumulation regions 16 having a higher first conductivity-type doping concentration than the drift region 18. It is the difference from the first embodiment. A region in which the accumulation regions 16 are provided is indicated with hatched line. The accumulation regions 16 of the present example are of N$^+$-type. In FIG. 6, the outer end portion of an area in which the accumulation regions 16 are provided is indicated by the dashed line that is finer than the dashed line of the collector region 22.

The semiconductor device 200 of the present example has accumulation regions 16 in both the transistor section 70 and the diode section 80. Dopants (donors in the present example) are accumulated at a higher concentration in the accumulation region 16 than in the drift region 18. The outer end portion of an accumulation region 16 may be provided on a further outer side than the emitter region 12 that is positioned on the most outer side in the Y-axis direction. In the present example, the Y-axis direction outer end portion of the accumulation region 16 is provided on an inner side relative to the Y-axis direction outer end portion 53 of the contact hole 54 that is positioned on the most outer side in the Y-axis direction. Accumulation regions 16 may also be provided in regions other than shown in FIG. 6, in the positive and negative X-axis directions and the positive Y-axis direction. In the transistor section 70, providing the accumulation regions 16 allows the carrier injection enhancement effect (IE effect) to be increased, and the ON voltage to be reduced.

Note that, to obtain the IE effect, it is also possible that accumulation regions 16 are provided only in the transistor section 70. However, if it is attempted to provide accumulation regions 16 only in the transistor section 70 but not in the diode section 80, the depth positions of the accumulation regions 16 can vary at the boundary between the transistor section 70 and the diode section 80. The variation in the depth positions of the accumulation regions 16 is caused due to, for example, sagging of resist as described below.

So, in the present example, accumulation regions 16 are provided in both the transistor section 70 and the diode section 80. This can prevent the variation in the depth positions of the accumulation regions 16. Therefore, the variation in the threshold voltage and the saturated current of the IGBT or the like in the transistor section 70, and reduction of the forward voltage of the FWD in the diode section 80, due to the variation in the depth positions of the accumulation regions 16, can be suppressed.

In the present example, the cathode region 82 provided on the lower-surface side of the diode section 80 is provided on an inner side relative to the Y-axis direction outer end portion of the accumulation regions 16 provided in the transistor section 70 by a length L. That is, the collector region 22 provided on the lower-surface side of the diode section 80 partially overlaps the accumulation region 16. For example, the collector region 22 is also provided directly below the Y-axis direction end portion of the accumulation region 16 in the diode section 80.

The collector region 22 in the diode section 80 may be provided continuously at least from a position directly below the Y-axis direction outer end portion 53 of the contact hole 54 to a position directly below the Y-axis direction end portion of the accumulation region 16. The collector region 22 of the present example is provided continuously from the Y-axis direction outer end portion to the boundary between the collector region 22 and the cathode region 82. In the upper surface of the semiconductor substrate 10 of the present example, the length from the Y-axis direction outer end portion of the accumulation region 16 to the boundary between the collector region 22 and the cathode region 82 is referred to as L. The value of the length L may be variable according to the position of the Y-axis direction outer end portion of the accumulation region 16. The length L may be some µm or more, dozens of µm or more, 100 µm or more, or 200 µm or more. The length L is preferably 400 µm or less in order for the diode section 80 to function appropriately. In this manner, functioning of the diode section 80 can be ensured while avoiding the current concentration at the end portion 53 of the contact portion.

A lifetime killer region 19 may be formed in a region including a part of the transistor section 70 having the mesa portion 94-1, the part ranging from a dummy trench portion 30 positioned beyond a gate trench portion 40 closest to the diode section 80 in the positive X-axis direction, and the entire region of the diode section 80. In the present example, a portion of the lifetime killer region 19 at an outer peripheral end in the Y-axis direction may be positioned on an outer peripheral side (negative Y-axis direction side) relative to the contact hole 55 of the gate runner 51. Also, a portion of the lifetime killer region 19 at an outer peripheral end in the Y-axis direction may be positioned on an outer peripheral side relative to the outer peripheral end portion of the gate runner 51.

Figure 7:
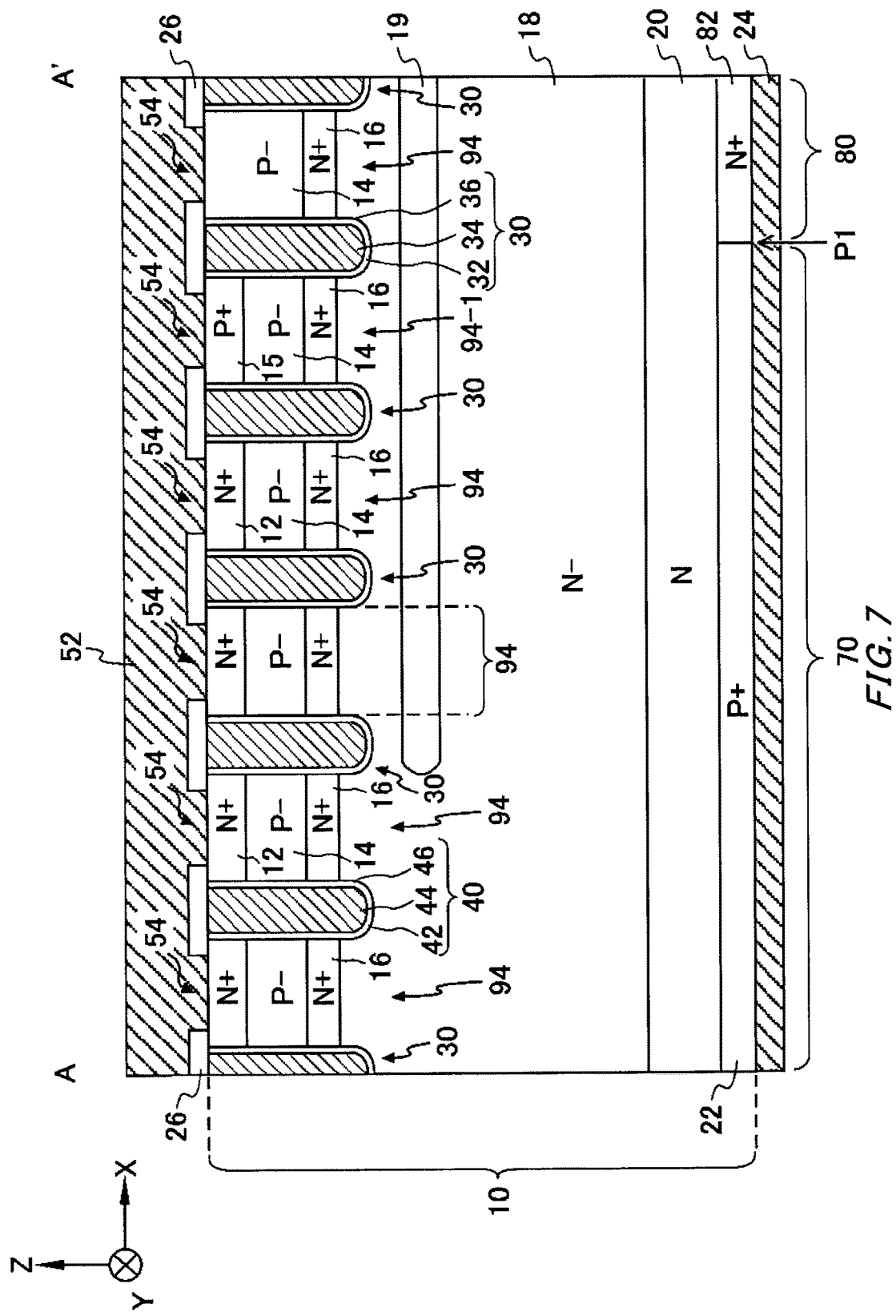
FIG. 7 is a cross-sectional view taken along A-A' in FIG. 6.

FIG. 7 is a cross-sectional view taken along A-A' in FIG. 6. The semiconductor substrate 10 of the present example has accumulation regions 16 between base regions 14 in the transistor section 70 and the drift region 18. The semiconductor substrate 10 of the present example also has an accumulation region 16 between the base region 14 in the diode section 80 (i.e. anode region) and the drift region 18. As described above, in the present example, accumulation regions 16 are provided in both the transistor section 70 and the diode section 80, and therefore the accumulation regions 16 can be provided at the same depth in the transistor section 70 and the diode section 80.

The lifetime killer region 19 of the present example may be formed closer, in the depth direction of the semiconductor substrate 10 (the Z-axis direction), to the upper surface of the semiconductor substrate 10 than the depth of the center of the semiconductor substrate 10. That is, a depth from the upper surface of the semiconductor substrate 10 to the lifetime killer region 19 may be smaller than a depth from the lifetime killer region 19 to the lower surface of the semiconductor substrate 10. The lifetime killer region 19 may be formed in a region including a part of the transistor section 70 having the mesa portion 94-1, the part ranging from a dummy trench portion 30 positioned beyond a gate trench portion 40 closest to the diode section 80 in the positive X-axis direction, and the entire region of the diode section 80.

Figure 8:
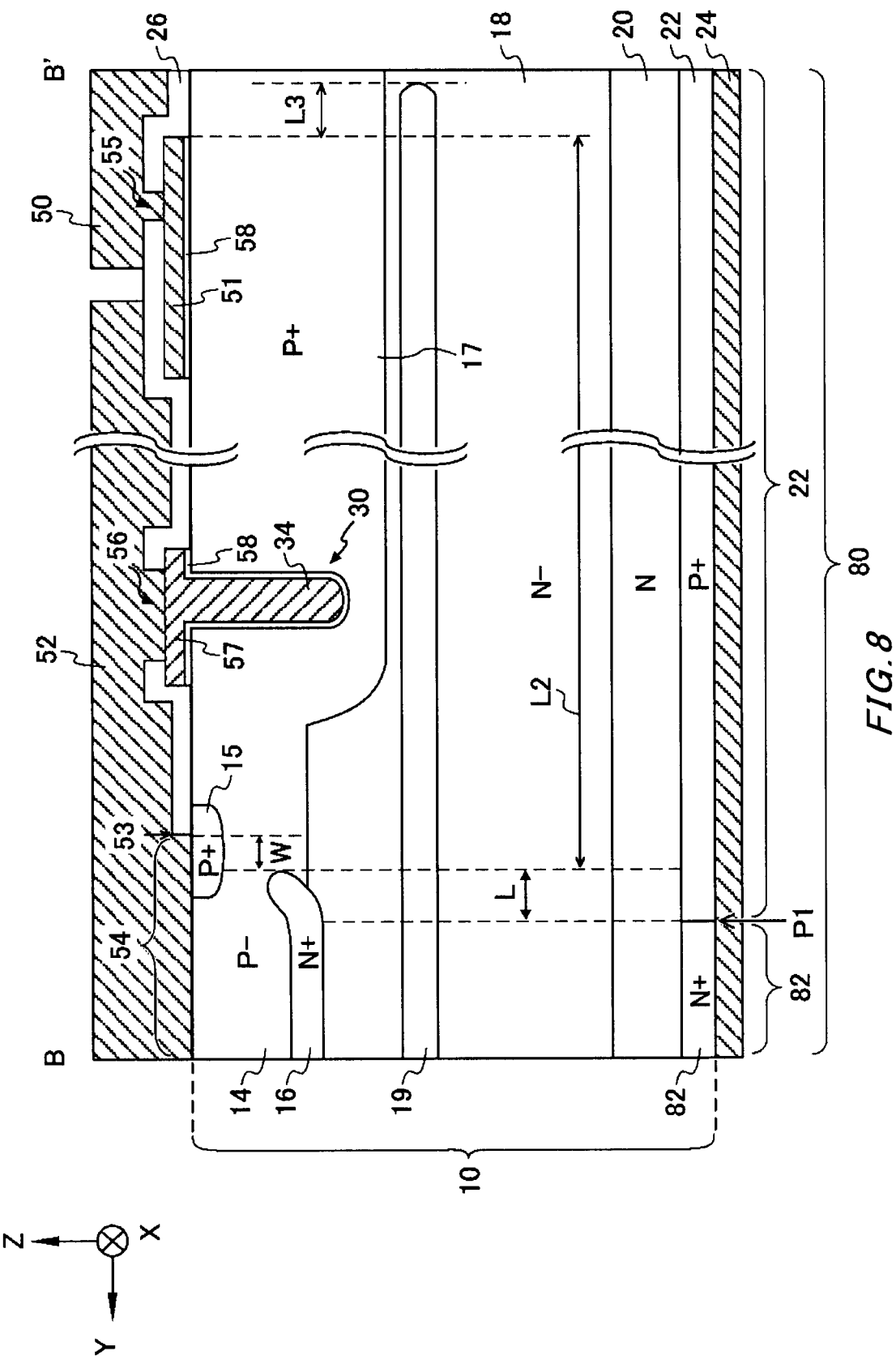
FIG. 8 is a cross-sectional view taken along B-B' in FIG. 6.

FIG. 8 is a cross-sectional view taken along B-B' in FIG. 6. FIG. 8 is the same as FIG. 3 of the first embodiment except that an accumulation region 16 is provided between the base region 14 and the drift region 18, and so similar descriptions are not repeated herein. The accumulation region 16 extends in the positive Y-axis direction from a position directly below the contact region 15. In the diode section 80 of the present example, as described above, the Y-axis direction outer end portion of the accumulation region 16 is provided on an inner side relative to the end portion 53 of the contact hole 54 that is positioned on the most outer side in the Y-axis direction (see the arrow). In the upper surface of the semiconductor substrate 10 of the present example, the length from the Y-axis direction outer end portion of the accumulation region 16 to the boundary between the collector region 22 and the cathode region 82 is referred to as W. In the present example, the collector region 22 in the diode section 80 may be provided continuously at least from a position directly below the end portion 53 of the contact hole 54 to a position directly below the Y-axis direction end portion of the accumulation region 16.

The Y-axis direction outer end portion of the accumulation region 16 may be provided on an outer side relative to the boundary between the collector region 22 and the cathode region 82. In this case, the length L from the Y-axis direction outer end portion of the accumulation region 16 to the boundary between the collector region 22 and the cathode region 82 may be greater than the length W from the end portion 53 of the contact hole 54 as the contact portion positioned on the most outer side in the Y-axis direction to the Y-axis direction outer end portion of the accumulation region 16. When the diode section 80 is conducting, holes injected from the base region 14 as an anode region flow toward the cathode region 82. While the accumulation region 16 suppresses the injection of holes from the base region 14, the accumulation region 16, in the present example, is not present in a region of the length W outer from the end portion of the accumulation region 16, and therefore holes are likely to be injected from the base region 14. However, since the boundary between the collector region 22 and the cathode region 82 is on an inner side relative to the end portion 53 of the contact hole 54, even though the position of the Y-axis direction outer end of the accumulation region 16 is on an inner side relative to the end portion 53, the injection of holes on an outer side relative to the end portion 53 is reduced. Furthermore, since the length L is greater than the length W, an excessive amount of holes is seldom injected into the region of length W. The present example is advantageous in this point.

In another example of the present example, the length W may be greater than the length L. In general, when the diode section 80 is conducting, holes exude to some extent on an outer side relative to the end portion 53. Because of that, currents in the diode section 80 are concentrated at the end portion 53 of the contact hole 54, increasing the current density at the end portion 53. On the other hand, during reverse recovery operation of the diode section 80, electric fields near the p-n junction between the base region 14 and the accumulation region 16 are likely to be concentrated particularly at the Y-axis direction outer end portion of the accumulation region 16. Therefore, the electric field strength at the Y-axis direction outer end portion of the accumulation region 16 increases. Since the length W is greater than the length L, the position at which the current density increases due to the current concentration (the end portion 53) and the position at which the electric field strength increases due to the electric field concentration (the Y-axis direction outer end portion of the accumulation region 16) can be sufficiently separated. In this manner, avalanche breakdown due to the mutual amplification of the current concentration and the electric field concentration can be avoided, increasing the reverse recovery withstand capability of the diode section 80.

In still another example of the present example, the Y-axis direction outer end portion of the accumulation region 16 may be provided on an inner side relative to the boundary between the collector region 22 and the cathode region 82. In other words, the boundary between the collector region 22 and the cathode region 82 may be positioned on an outer side relative to the Y-axis direction outer end portion of the accumulation region 16. Note that, in this case as well, the boundary between the collector region 22 and the cathode region 82 is on an inner side in the Y-axis direction relative to the end portion 53 of the contact hole 54.

In the present example, a portion of the lifetime killer region 19 at an outer peripheral end in the Y-axis direction may be positioned on an outer peripheral side (negative Y-axis direction side) relative to the contact hole 55 of the gate runner 51. Also, a portion of the lifetime killer region 19 at an outer peripheral end in the Y-axis direction may be positioned on an outer peripheral side relative to the outer peripheral end portion of the gate runner 51. A length L2 from the Y-axis direction outer end portion of the accumulation region 16 to the Y-axis direction outer end portion of the gate runner 51 may be greater than a length L3 from the Y-axis direction outer end portion of the gate runner 51 to the Y-axis direction outer end portion of the lifetime killer region 19.

In the present example, a portion of the lifetime killer region 19 at an outer peripheral end in the Y-axis direction may be positioned on an outer side (outer peripheral side) relative to the the Y-axis direction outer (outer peripheral) end portion of the contact hole 54 in the diode section 80. A portion of the lifetime killer region 19 at an outer peripheral end in the Y-axis direction may be positioned on an outer side relative to the outer end portion of the contact region 15 including the Y-axis direction outer (outer peripheral) end portion of the contact hole 54. A portion of the lifetime killer region 19 at an outer peripheral end in the Y-axis direction may be positioned on an outer side relative to the boundary between the base region 14 and the well region 17. A portion of the lifetime killer region 19 at an outer peripheral end in the Y-axis direction may be positioned on an outer peripheral side (negative Y-axis direction side) relative to the contact hole of the gate runner 51. Also, a portion of the lifetime killer region 19 at an outer peripheral end in the Y-axis direction may be positioned on an outer peripheral side relative to the outer peripheral end portion of the gate runner 51.

A portion of the lifetime killer region 19 at an outer peripheral end in the Y-axis direction may be positioned on an inner side relative to the outer peripheral end portion of the well region 17 (not shown). Thus, accumulated charges accumulated in a region of the diode section 80 on an outer side relative to the contact hole 54 can be reduced, and the reverse recovery withstand capability of the semiconductor device 200 can be improved.

FIG. 9 is an enlarged partial view of the accumulation region 16 near the contact region 15 in FIG. 8. The accumulation region 16 of the present example has a flat region 62 and an end region 64. The flat region 62 is at least positioned above the cathode region 82, and has a predetermined depth. In contrast, the end region 64 is positioned above the collector region 22, and its depth at a more outer side in the Y-axis direction is shallower. The end region 64 is positioned on an outer side relative to the flat region 62. The end region 64 of the present example is provided at a position same as the flat region 62 or a shallower than the flat region 62. The edge of the end region 64 may not be in contact with the drift region 18. The edge of the end region 64 may be provided at a shallower position than the middle of the base region 14 in the Z-axis direction. The shape of the end region 64 is formed due to, for example, sagging of resist as described below.

The accumulation region 16 of the present example can be formed by using a mask as described below. The shape of the end region 64 of the accumulation region 16 can be controlled by adjusting the shape of the mask. As one example, temperature or time for baking the mask, thickness of the mask, or material of the mask may be adjusted. Note that, since channels of the IGBT in the transistor section 70 are formed directly below the emitter regions 12, even when the end region 64 of the present example is formed directly below the contact regions 15 positioned on the most outer side in the Y-axis direction, no problem is caused on the operation of the semiconductor device 200.

Figure 10:
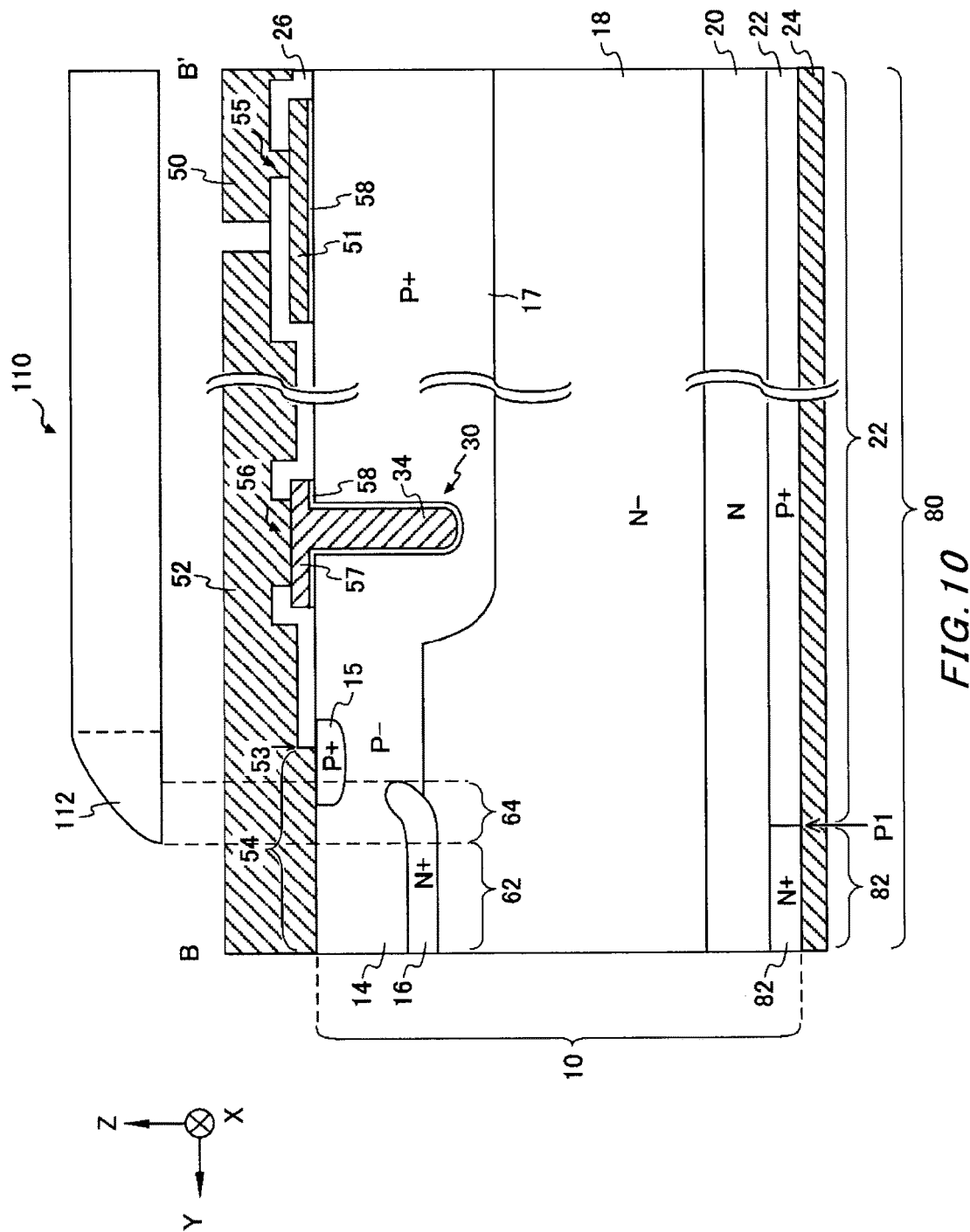
FIG. 10 illustrates sagging of the mask when forming the accumulation region 16.

FIG. 10 illustrates sagging of the mask when forming the accumulation region 16. FIG. 10 is a diagram to which a mask 110 having an excess portion 112 is added with respect to FIG. 8. It is the same as FIG. 8 except for the mask 110, and so similar descriptions are not repeated herein.

The mask 110 is used in a step of injecting impurities into a region corresponding to the accumulation region 16. The mask 110 is arranged covering a region in which the accumulation region 16 is not formed. During the ion injection of impurities, the accumulation region 16 is not formed in a region covered by the mask 110, and the accumulation region 16 is formed in a region that is not covered by the mask 110. The mask 110 may be formed by applying resist or the like and patterning it into a predetermined shape.

The end portion of the mask 110 is preferably formed to be perpendicular to the upper surface of the semiconductor substrate 10. However, in reality, sagging of resist in the mask 110 may be caused to form an excess portion 112. When the excess portion 112 is formed, the accumulation region 16 is not formed at a predetermined depth in a mesa portion 94 covered by the excess portion 112. For example, in a mesa portion 94 covered by the excess portion 112, the accumulation region 16 is not formed at all or formed shallower than a predetermined depth. Note that, although the flat region 62 and the end region 64 of the present example are provided continuously, the flat region 62 and the end region 64 may also be provided discontinuously in the depth direction.

Figure 11:
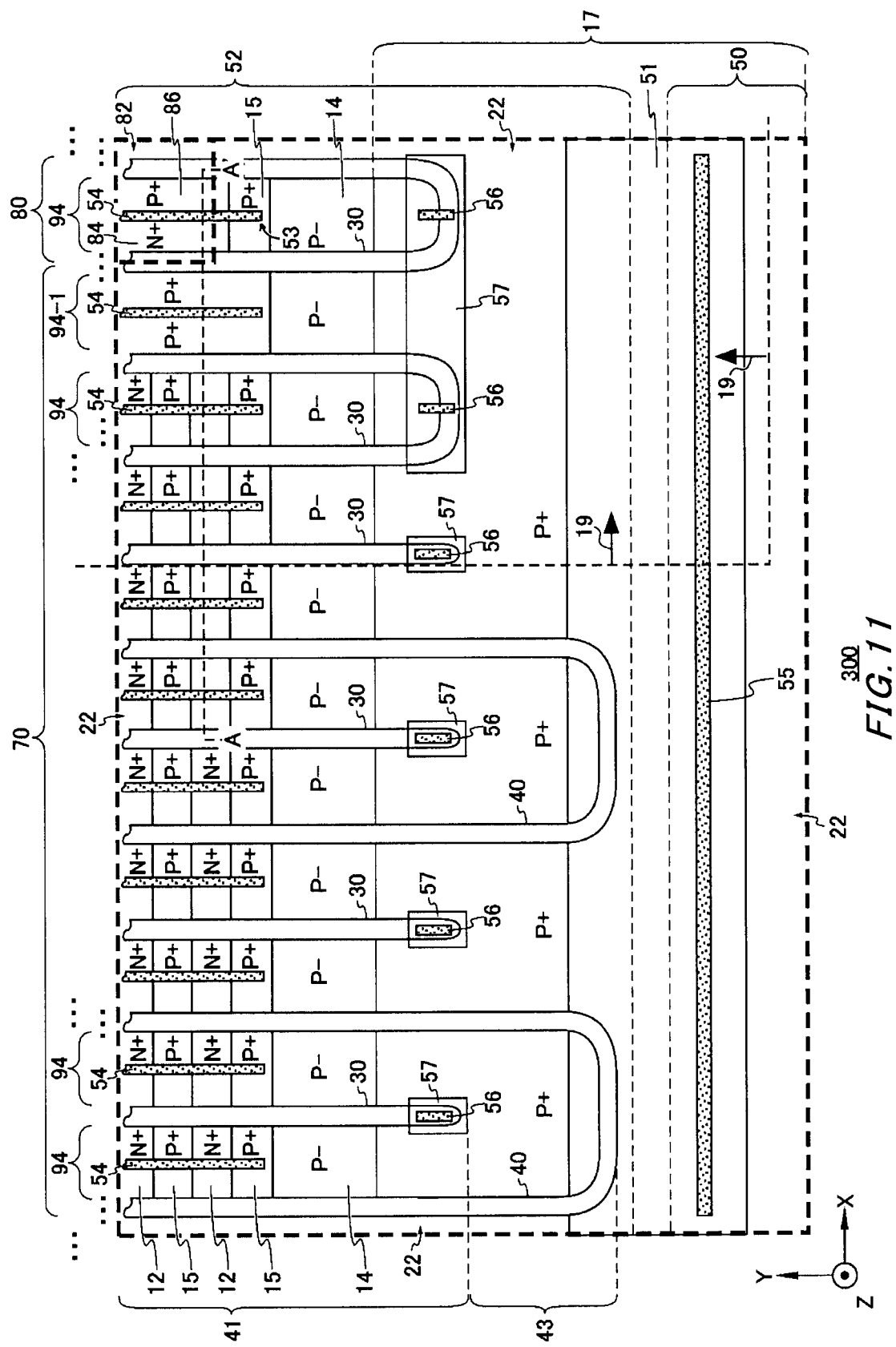
FIG. 11 is a top view of a semiconductor device 300 according to a third embodiment.

FIG. 11 is a top view of a semiconductor device 300 according to a third embodiment. The mesa portion 94 in the diode section 80 of the present example includes a high-concentration first conductivity-type region 84 and a high-concentration second conductivity-type region 86 between a plurality of dummy trench portions 30. The third embodiment is different from the second embodiment in that point, but other points may be the same as the second embodiment.

The high-concentration first conductivity-type region 84 may have a higher first conductivity-type doping concentration than the drift region 18. The high-concentration first conductivity-type region 84 may have the same degree of N-type doping concentration as the emitter regions 12. Also, the high-concentration first conductivity-type region 84 may have the same degree of depth as the emitter regions 12. The high-concentration first conductivity-type region 84 of the present example is of $N^+$-type. Also, the high-concentration second conductivity-type region 86 may have a higher second conductivity-type doping concentration than the base region 14 in the diode section 80. The high-concentration second conductivity-type region 86 may have the same degree of P-type doping concentration as the contact regions 15. The high-concentration second conductivity-type region 86 may have the same degree of depth as the contact regions 15. The high-concentration second conductivity-type region 86 of the present example is of $P^+$-type.

In the present example, the high-concentration first conductivity-type region 84 and the high-concentration second conductivity-type region 86 extend in the extending direction of the trench portions (i.e. the Y-axis direction). The high-concentration first conductivity-type region 84 and the high-concentration second conductivity-type region 86 of the present example are positioned on an inner side in the extending direction relative to the contact region 15. If base regions 14 are provided at both Y-axis direction ends of the diode section 80, and two contact regions 15 are provided between the base regions 14 at both ends, being in contact with the base regions 14 at both ends, the high-concentration first conductivity-type region 84 and the high-concentration second conductivity-type region 86 may extend continuously between the two contact region 15.

The high-concentration first conductivity-type region 84 and the high-concentration second conductivity-type region 86 of the present example are adjacent to each other in the array direction of the trench portions (i.e. the X-axis direction). The high-concentration first conductivity-type region 84 and the high-concentration second conductivity-type region 86 of the present example are in contact with each other directly below the contact hole 54.

Figure 12:
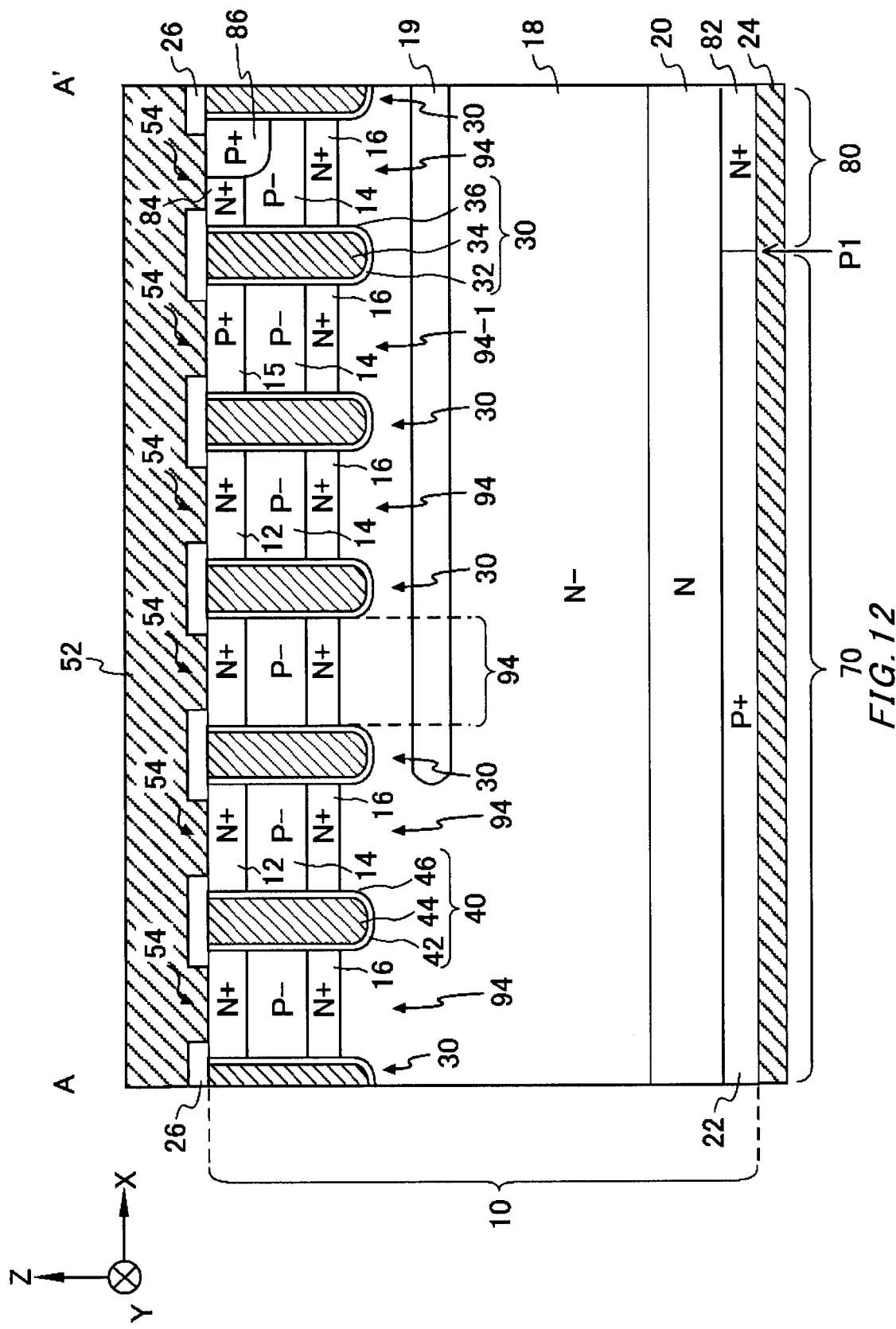
FIG. 12 is a cross-sectional view taken along A-A' in FIG. 11.

FIG. 12 is a cross-sectional view taken along A-A' in FIG. 11. FIG. 12 is a cross section parallel to the X-Z plane that passes through the high-concentration first conductivity-type region 84 and the high-concentration second conductivity-type region 86. The upper surfaces of the high-concentration first conductivity-type region 84 and the high-concentration second conductivity-type region 86 may coincide with the front surface of the semiconductor substrate 10. The high-concentration first conductivity-type region 84 and the high-concentration second conductivity-type region 86 are connected to the emitter electrode 52 through the contact hole 54. The bottom portion of the high-concentration first conductivity-type region 84 may coincide with the bottom portions of emitter regions 12 and contact regions 15 in the transistor section 70. The bottom portion of the high-concentration second conductivity-type region 86 may be positioned deeper than the bottom portion of the high-concentration first conductivity-type region 84. Note that, the bottom portion of the high-concentration second conductivity-type region 86 may be positioned shallower than the accumulation region 16.

In the present example, accumulation regions 16 are provided in both the transistor section 70 and the diode section 80. Therefore, problems caused in the case of providing accumulation regions 16 only in the transistor section 70, i.e. the following problems (1) to (3) due to sagging of the mask, can be eliminated:
(1) variation in the threshold voltage (Vth) of the transistor section 70; (2) variation in the saturated current of the transistor section 70; and (3) lower constant value of the forward voltage (Vf) of the diode section 80 due to currents flowing from the transistor section 70 into the diode section 80.

In addition, in the present example, by providing the high-concentration first conductivity-type region 84 and the high-concentration second conductivity-type region 86, the forward voltage (Vf) can be lowered compared to the second embodiment if a large current flows in the diode section 80. That is, if a large current flows in the diode section 80, a high concentration of holes due to the high-concentration second conductivity-type region 86 contributes to conduction of the diode, and therefore the forward voltage (Vf) can be lowered only when conducting a large current.

Figure 13:
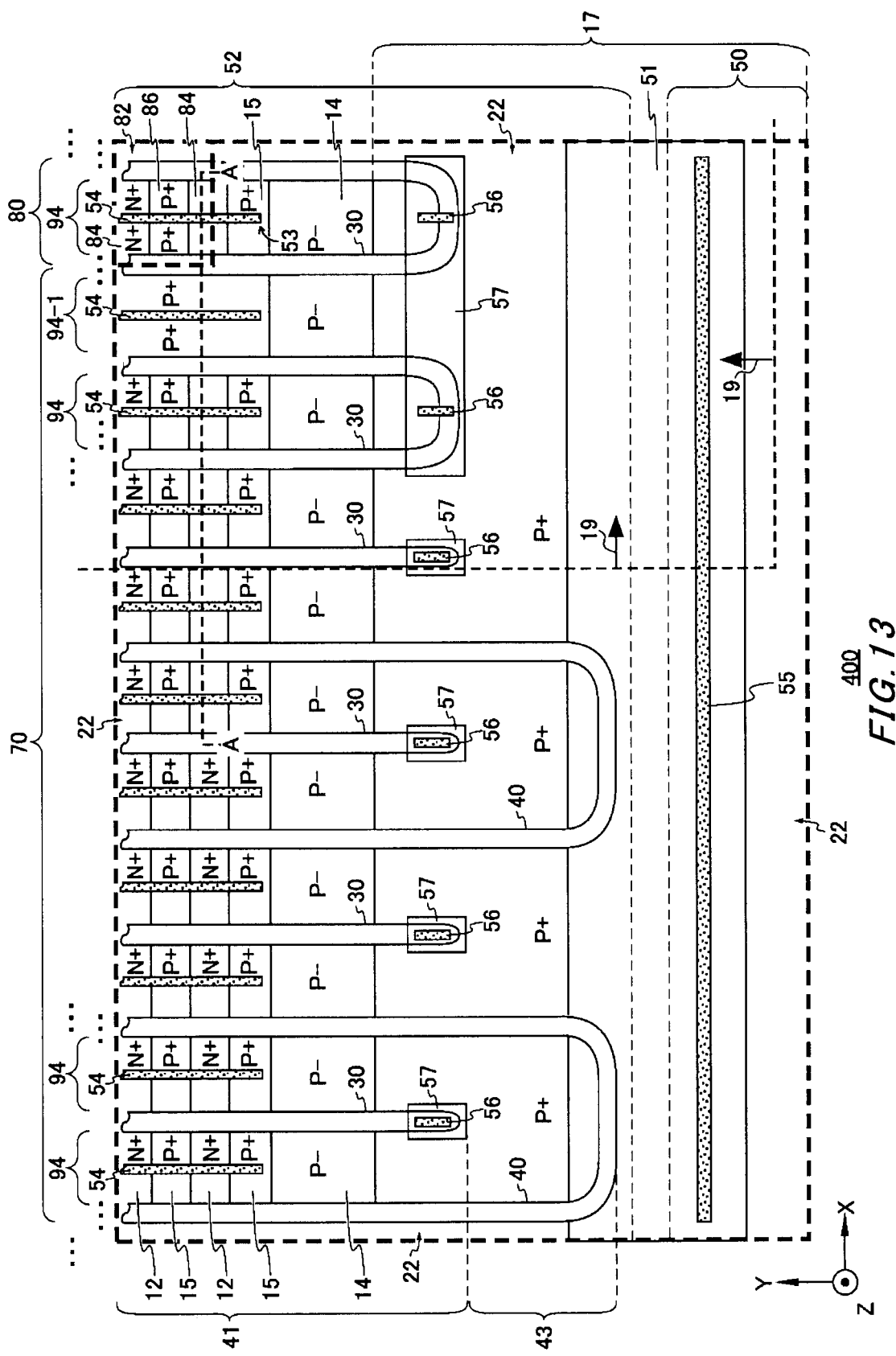
FIG. 13 is a top view of a semiconductor device 400 according to a fourth embodiment.

FIG. 13 is a top view of a semiconductor device 400 according to a fourth embodiment. The fourth embodiment is different from the third embodiment in arrangement of the high-concentration first conductivity-type region 84 and the high-concentration second conductivity-type region 86. The high-concentration first conductivity-type region 84 and the high-concentration second conductivity-type region 86 of the present example extend in the array direction, and are adjacent to each other in the extending direction. In the present example, the high-concentration first conductivity-type region 84 and the high-concentration second conductivity-type region 86 are provided alternately in the extending direction. Note that, in the present example as well, the upper surfaces of the high-concentration first conductivity-type region 84 and the high-concentration second conductivity-type region 86 coincide with the front surface of the semiconductor substrate 10, and the bottom portions of the high-concentration second conductivity-type region 86 is positioned deeper than the bottom portion of the high-concentration first conductivity-type region 84.

Figure 14:
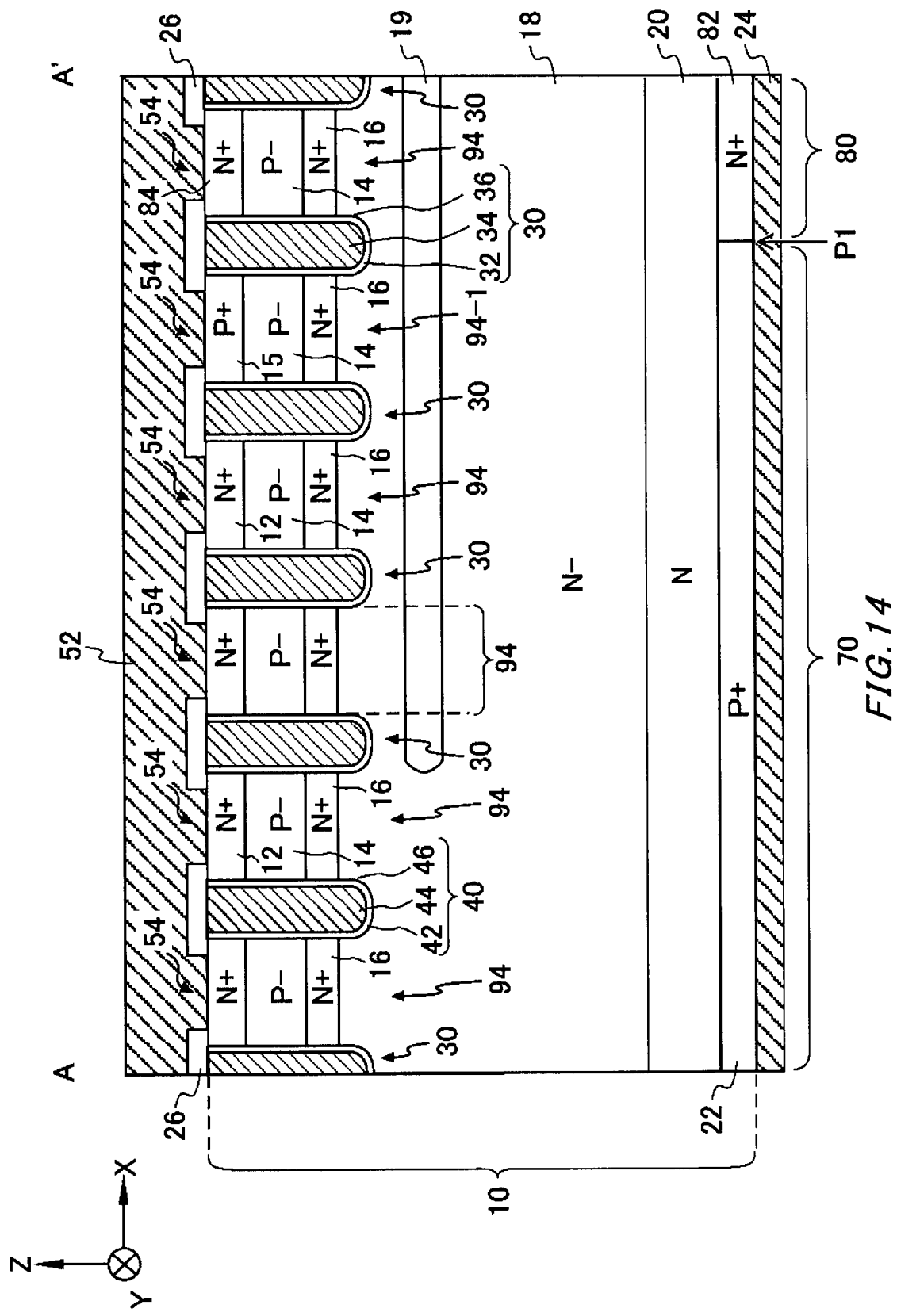
FIG. 14 is a cross-sectional view taken along A-A' in FIG. 13.

FIG. 14 is a cross-sectional view taken along A-A' in FIG. 13. FIG. 14 is a cross section parallel to the X-Z plane that passes through the high-concentration first conductivity-type region 84. In the present example as well, the same advantageous effects as the third embodiment can be obtained.

Figure 15A:
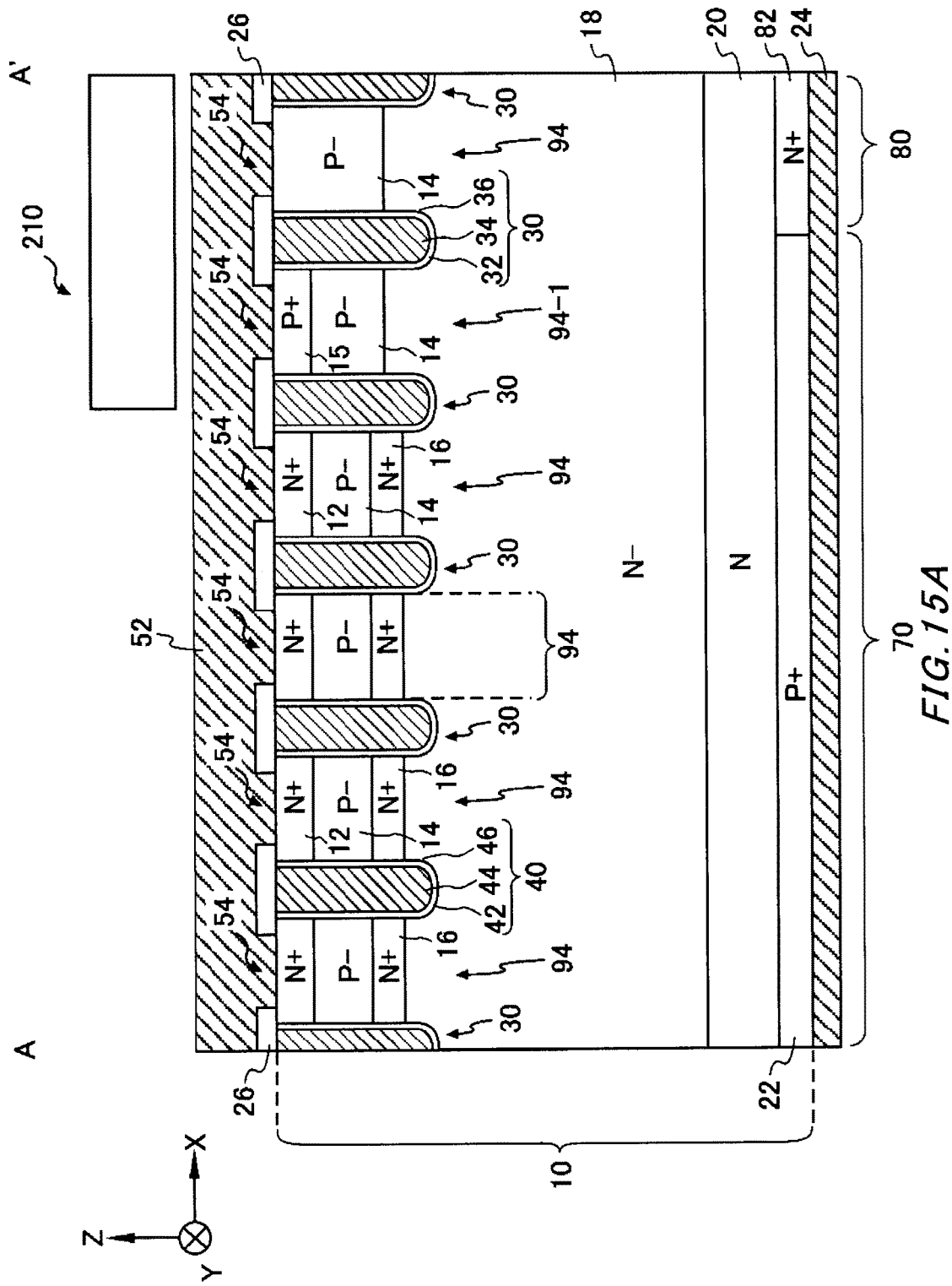
FIG. 15A is a cross-sectional view taken along A-A' according to a first comparative example.

FIG. 15A is a cross-sectional view taken along A-A' according to a first comparative example. The first comparative example is an example where accumulation regions 16 are provided only in a part of the transistor section 70. In FIG. 15A, an ideal shape of the mask 210 used when providing the accumulation region 16 only in a part of the transistor section 70 is shown. However, in reality, the steep end portion of the mask 210 that is positioned above the transistor section 70 may sag down.

Figure 15B:
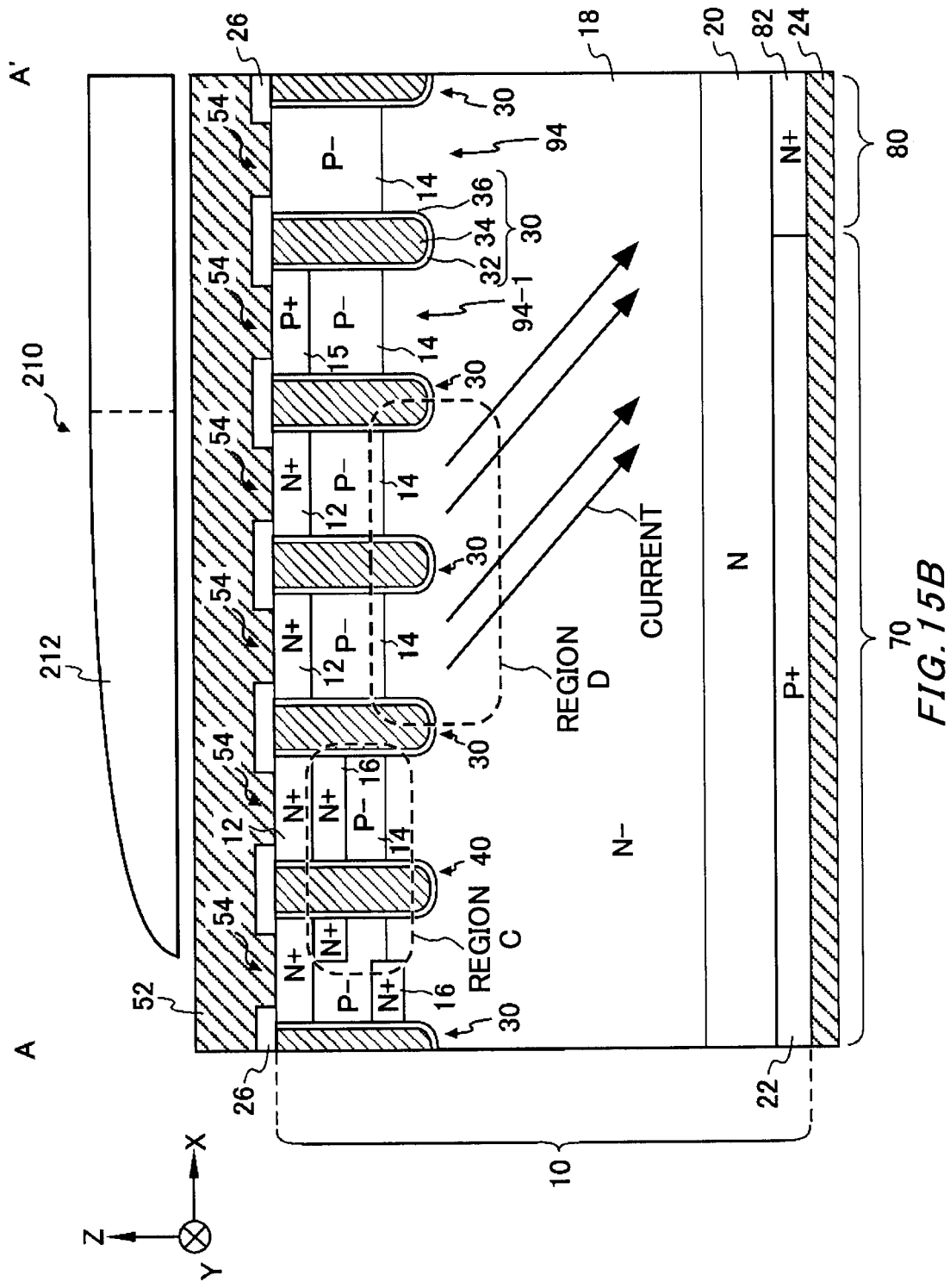
FIG. 15B is a cross-sectional view taken along A-A' according to a second comparative example.

FIG. 15B is a cross-sectional view taken along A-A' according to a second comparative example. The second comparative example is also an example where accumulation regions 16 are provided only in a part of the transistor section 70. Note that, the mask 210 in FIG. 15B has an excess portion 212 created after a predetermined time, in addition to its ideal shape immediately after formed. The sagging of the mask described above corresponds to the excess portion 212. If the Z-axis direction thickness of the mask 210 is 5 μm for example, the X-axis direction length of the excess portion 212 is 5.8 μm for example.

Due to the sagging of the mask, the above-described problems (1) to (3) are caused. For example, in the region C, the above-described problems (1) and (2) are caused due to accumulation regions 16 near gate trench portions 40 not being provided at a predetermined depth position. For example, in the region D, the above-described problem (3) is caused due to accumulation regions 16 not being formed. In contrast, according to the second to fourth embodiments, accumulation regions 16 are provided in both the transistor section 70 and the diode section 80, and thereby the above-described problems (1) to (3) can be eliminated.

Figure 16:
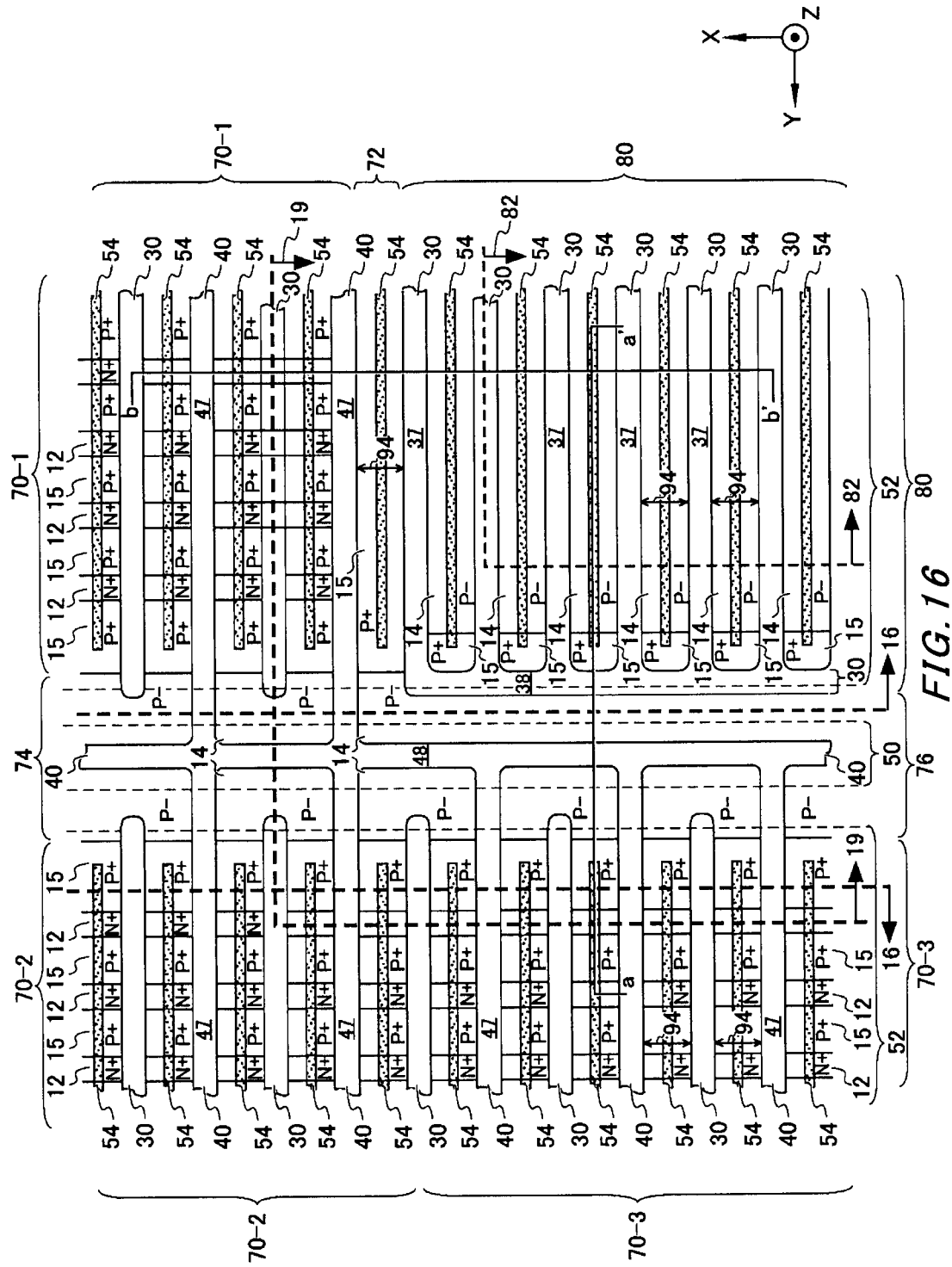
FIG. 16 is a top view showing a corner portion of the diode section 80 adjacent to the transistor section 70.

FIG. 16 is a top view showing a corner portion of the diode section 80 adjacent to the transistor section 70. Note that FIG. 16 is not a top view around an end portion of the semiconductor substrate 10, but is a top view in a region closer to the center of the semiconductor substrate 10 than to the end portion. Structures shown in the present example may be applied to the semiconductor devices 100 to 400.

The semiconductor device may include a plurality of transistor sections 70 and a plurality of diode sections 80. The X-axis direction and Y-axis direction end portions of the diode section 80 may be adjacent to the transistor section 70, and a corner portion of the diode section 80 may be adjacent to the transistor section 70. In the present example, at least a corner portion of the diode section 80 and two sides of the diode section 80 forming the corner portion are surrounded by a plurality of transistor sections 70.

The gate trench portion 40 may be provided to have a a grid shape when the semiconductor substrate 10 is seen from top. The gate trench portion 40 may be continuous across a plurality of transistor sections 70. The gate trench portion 40 of the present example includes a first portion 47 extending in the Y-axis direction and a second portion 48 extending in the X-axis direction. In the gate trench portion 40, the second portion 48 may be connected to a plurality of first portions 47. Mesa portions 94 are positioned between first portions 47 of the gate trench portion 40 extending in the Y-axis direction and dummy trench portions 30 in the transistor section 70.

The diode section 80 of the present example includes a dummy trench portion 30 having a comb teeth-shape. The comb teeth-shaped dummy trench portion 30 may include a first portion 37 extending in the Y-axis direction and a second portion 38 extending in the X-axis direction. In the diode section 80, a plurality of first portions 37 may be provided being spaced from each other in the X-axis direction. In the diode section 80, the second portion 38 may be connected to the positive Y-axis direction end portions of a plurality of first portions 37. In the diode section 80 of the present example, a P$^+$-type contact region 15 is provided near connecting portions of the first portions 37 and the second portion 38 of the dummy trench portion 30.

The connecting portions of the first portions 37 and the second portion 38 of the dummy trench portion 30 in the diode section 80 may be surrounded by the base region 14 in the X-Y plane in the upper surface of the semiconductor substrate 10. Further, the connecting portions may be surrounded by portions where the first portions 47 and the second portion 48 of the gate trench portion 40 cross. This allows electric field strength at the connecting portions to be relieved.

The diode section 80 may be adjacent to the transistor section 70-3 with the gate metal layer 50 interposed therebetween in the positive Y-axis direction. Also, the diode section 80 may be adjacent to the transistor section 70-3 with the second portion 48 of the gate trench portion 40 interposed therebetween in the positive Y-axis direction. Note that the second portion 48 of the gate trench portion 40 may be surrounded by the P$^+$-type well region 17. The boundary between the diode section 80 and the transistor section 70-3 in the Y-axis direction may be positioned in the well region 17 surrounding the second portion 48 of the gate trench portion 40.

The boundary between the diode section 80 and the transistor section 70-1 may be positioned at a first portion 37 of the dummy trench portion 30. In the present example, the boundary between the diode section 80 and the transistor section 70-1 may extend in parallel with the Y-axis direction at a first portion 37 of the dummy trench portion 30. The X-axis direction position of the boundary between the diode section 80 and the transistor section 70-1 may coincide with that of the boundary between the transistor section 70-2 and the transistor section 70-3 in the X-axis direction.

A mesa portion 94 which is between the transistor section 70-1 and the diode section 80 and has the contact region 15 formed therein to surround the entire contact hole 54 may be referred to as a first boundary section 72. A region which: ranges from an end of the contact region 15 in the transistor section 70-1 that is adjacent to the second portion 48 of the gate trench portion 40 to an end of the contact region 15 in the transistor section 70-2 that is adjacent to the second portion 48 of the gate trench portion 40; and includes the second portion 48 of the gate trench portion 40 may be referred to as a second boundary section 74. A region which: ranges from an end of the contact region 15 in the transistor section 70-3 that is adjacent to the second portion 48 of the gate trench portion 40 to the second portion 38 of the dummy trench portion 30 in the diode section 80; and includes the second portion 48 of the gate trench portion 40 may be referred to as a third boundary section 76.

The second boundary section 74 and the third boundary section 76 may be in contact with each other in the X-axis direction. The first boundary section 72 may cross the second boundary section 74 or the third boundary section 76. Note that at least an area in which the first portion 37 and the second portion 38 of the dummy trench portion 30 are provided may be regarded as being in the diode section 80. Also, the second boundary section 74 and the third boundary section 76 may be the second portion 48 of the gate trench portion 40 itself, and in this case, the transistor section 70-3 and the diode section 80 may each be regarded as reaching a sidewall of the second portion 48 of the gate trench portion 40.

In the transistor section 70, the X-axis direction width of the first portion 47 of the gate trench portion 40 and the X-axis direction width of the dummy trench portion 30, and the Y-axis direction width of the second portion 48 of the gate trench portion 40 may be the same. In the diode section 80, the X-axis direction width of the first portion 37 of the dummy trench portion 30 and the Y-axis direction width of the second portion 38 of the dummy trench portion 30 may be the same.

The X-axis direction width of the first portion 47 of the gate trench portion 40, the X-axis direction width of the dummy trench portion 30 and the Y-axis direction width of the second portion 48 of the gate trench portion 40 in the transistor section 70 may be the same as the X-axis direction width of the first portion 37 of the dummy trench portion 30 and the Y-axis direction width of the second portion 38 of the dummy trench portion 30 in the diode section 80. The X-axis direction width of a mesa portion 94 in the transistor section 70 may be the same as the X-axis direction width of a mesa portion 94 in the diode section 80.

A length from the Y-axis direction end of the dummy trench portion 30 in the transistor section 70-2 to the second portion 48 of the gate trench portion 40 may be the same as a length from the Y-axis direction end of the dummy trench portion 30 in the transistor section 70-1, which is adjacent to the transistor section 70-2 with the gate trench portion 40 interposed therebetween, to the second portion 48 of the gate trench portion 40. A length from the Y-axis direction end of the dummy trench portion 30 in the transistor section 70 to the second portion 48 of the gate trench portion 40 may be the same as or less than the X-axis direction width of a mesa portion 94 in the transistor section 70.

The Y-axis direction width of a mesa portion between the second portion 48 of the gate trench portion 40 and the second portion 38 of the dummy trench portion 30 in the diode section 80 may be the same as or less than the X-axis direction width of a mesa portion 94 in the transistor section 70 or the diode section 80. Thus, a potential distribution at the bottom portion of a trench portion when a gate voltage is OFF and a source voltage is applied between the collector electrode 24 and the emitter electrode 52 is made uniform, and local increase in the electric field strength at the bottom portion of the trench portion is suppressed.

The gate metal layer 50 may be positioned on the second portion 48 of the gate trench portion 40. The gate metal layer 50 may, directly or through a plug, contact the gate conductive portion 44 provided in the second portion 48 of the gate trench portion 40. The gate metal layer 50 may have a lower resistance than the gate runner 51, which is formed of polysilicon doped with impurities or the like. By electrically connecting the gate metal layer 50 having a low resistance and the gate conductive portion 44 without the gate runner 51 of polysilicon or the like therebetween, delay of gate signals can be suppressed. Similarly, in the present example, the dummy conductive portion 34 of the dummy trench portion 30 is directly connected to the emitter electrode 52 via a contact hole. Note that, the dummy conductive portion 34 may be in contact with the emitter electrode 52 via a plug provided to the contact hole.

Note that, in another example, the second portion 48 of the gate trench portion 40 and the gate metal layer 50 may not be provided at portions at which transistor sections 70 are adjacent to each other in the Y-axis direction. For example, a cell structure including an emitter region 12 and a contact region 15 is provided in a boundary region between the transistor section 70-1 and the transistor section 70-2. More specifically, in the boundary region between the transistor section 70-1 and the transistor section 70-2, a dummy trench portion 30 may be provided continuously in the Y-axis direction and an emitter region 12 and a contact region 15 may be provided repeatedly in the Y-axis direction in accordance with the dummy trench portion 30 provided continuously.

The cathode region 82 may be positioned on an inner side relative to a first portion 37 of the dummy trench portion 30 which is closest to the transistor section 70-1. In the present example, the X-axis direction end portion of the cathode region 82 is positioned below a first portion 37 of the dummy trench portion 30 which is second closest to the transistor section 70-1. Also, the cathode region 82 may be positioned on an inner side relative to the second portion 48 of the gate trench portion 40. In the present example, the Y-axis direction end portion of the cathode region 82 is positioned beyond the second portion 38 of the dummy trench portion 30 in the diode section 80 in the negative Y-axis direction.

The semiconductor substrate 10 may include a lifetime killer region 19. The lifetime killer region 19 may be provided in the transistor section 70 as well as the diode section 80. In the present example, the lifetime killer region 19 is provided in a part of the transistor sections 70-1, 70-2 and 70-3 adjacent to the diode section 80.

A length for which the lifetime killer region 19 extends beyond the third boundary section 76 to the transistor section 70-3 may be the same as or greater than a length for which it extends beyond the first boundary section 72 to the transistor section 70-1. This makes it possible to prevent accumulated charges accumulated in the third boundary section 76 in the depth direction of the semiconductor substrate 10 from being concentrated at an end portion of the contact hole 54 in the diode section 80 closer to the third boundary section 76, during reverse recovery operation of the diode section 80.

A length for which the lifetime killer region 19 extends beyond the first boundary section 72 to the transistor section 70-1 may be the same as or greater than a length for which it extends beyond the third boundary section 76 to the transistor section 70-3. Accumulated charges that are parasitically injected from the transistor section 70-1 and accumulated can be prevented from being concentrated at a contact hole 54 which is among contact holes 54 in the diode section 80 and has the cathode region 82 on its lower surface and is in a mesa portion 94 closest to the first boundary section 72, during the reverse recovery operation of the diode section 80. The semiconductor substrate 10 may include an accumulation region 16. The accumulation region 16 of the present example is provided in the transistor sections 70-1, 70-2 and 70-3 and the diode section 80.

Figure 17:
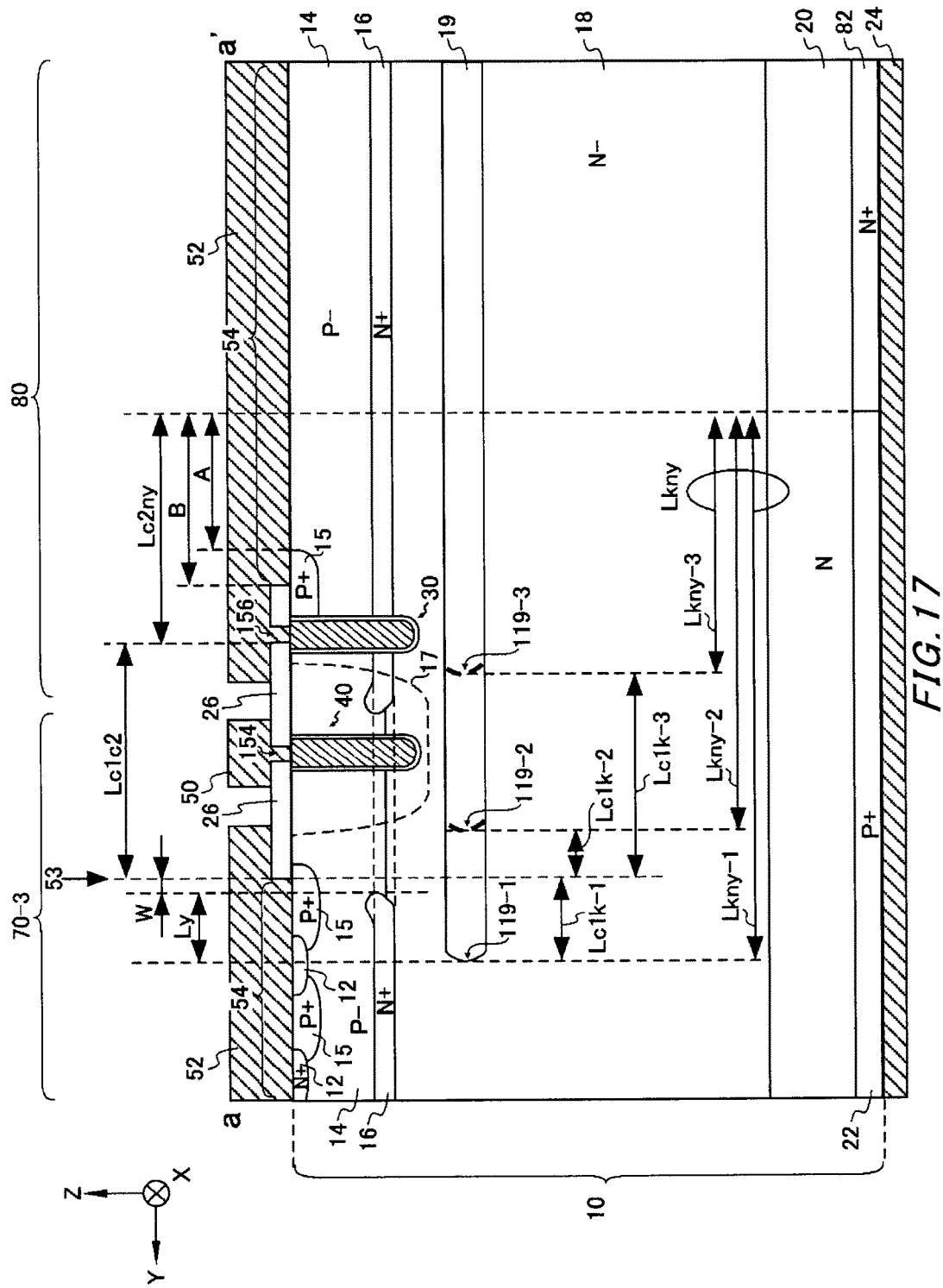
FIG. 17 is a cross-sectional view taken along a-a' in FIG. 16.

FIG. 17 is a cross-sectional view taken along a-a' in FIG. 16. The cross-sectional view taken along a-a' is in parallel with the Y-Z plane. The line a-a' passes through a contact hole 54 provided on a mesa portion 94 in the transistor section 70-3 and a contact hole 54 provided on a mesa portion 94 in the diode section 80. The line a-a' also passes through the second portion 48 of the gate trench portion 40 and the second portion 38 of the dummy trench portion 30.

The accumulation region 16 of the present example is provided to be discontinuous at the second portion 48 of the gate trench portion 40. Note that, in another example, the accumulation region 16 may be continuous at the second portion 48 of the gate trench portion 40 as indicated by dashed line in FIG. 17. That is, the accumulation region 16 may be provided in a form of a single surface across the entire region of the transistor section 70 and the diode section 80.

The accumulation region 16 in the diode section 80 may extend beyond the dummy trench portion 30 toward the transistor section 70-3 in the Y-axis direction. Even if it extends, it may be considered that the gate threshold voltage of the transistor section 70 is not affected compared to the case where it does not extend. In the present example, the accumulation region 16 in the diode section 80 extends beyond the dummy trench portion 30 in the Y-axis direction and ends before the gate trench portion 40.

In the transistor section 70-3 of the present example, a length from the positive Y-axis direction end portion 119 of the lifetime killer region 19 to the negative Y-axis direction end portion of the accumulation region 16 is referred to as Ly. Also, in the transistor section 70-3, a length from an end portion 53 of a contact hole 54 positioned on the most outer side in the Y-axis direction to the Y-axis direction outer end portion of the accumulation region 16 is referred to as W. In the present example, the length Ly is greater than the length W. Note that the length W may be greater than the length Ly.

In the present example, the gate conductive portion 44 of the gate trench portion 40 and the gate metal layer 50 are connected via a contact hole 154 provided in the interlayer insulating film 26. Also, in the present example, the dummy conductive portion 34 of the dummy trench portion 30 and the emitter electrode 52 are connected via a contact hole 156 provided in the interlayer insulating film 26.

In the present example, a length from the positive Y-axis direction end portion of the contact hole 156 in the diode section 80 to the boundary between the cathode region 82 and the collector region 22 is referred to as Lc2ny. That is, in the present example, the boundary between the cathode region 82 and the collector region 22 is positioned back from the positive Y-axis direction end portion of the contact hole 156 in the diode section 80 by Lc2ny. The length Lc2ny may be greater than the Z-axis direction thickness of the semiconductor substrate 10 (a length from its upper surface to its lower surface). In the present example, the length Lc2ny is 50 μm. Note that the length A and the length B are the same as those described with reference to FIG. 3.

The lifetime killer region 19 may be provided at least in the diode section 80. The lifetime killer region 19 may be provided in the diode section 80 and a part of the transistor section 70. The lifetime killer region 19 of the present example extends beyond the negative Y-axis direction end portion of the contact hole 54 in the transistor section 70-3 in the positive Y-axis direction. In the present example, the positive Y-axis direction end portion 119-1 of the lifetime killer region 19 is positioned below an emitter region 12 positioned farthest in the negative Y-axis direction in the transistor section 70-3.

In another example, the positive Y-axis direction end portion 119-2 of the lifetime killer region 19 may be positioned below a region positioned between the negative Y-axis direction end portion of the contact hole 54 in the transistor section 70-3 and the second portion 48 of the gate trench portion 40. Also, in still another example, the positive Y-axis direction end portion 119-3 of the lifetime killer region 19 may be positioned below a region positioned between the second portion 48 of the gate trench portion 40 and the second portion 38 of the dummy trench portion 30.

In the present example, a length between the positive Y-axis direction end portion 119 of the lifetime killer region 19 and the negative Y-axis direction end portion of the contact hole 54 in the transistor section 70-3 is referred to as Lc1k. A length Lc1k-1 may correspond to the end portion 119-1. Similarly, a length Lc1k-2 may correspond to the end portion 119-2 and a length Lc1k-3 may correspond to the end portion 119-3.

The length Lc1k-1 may be greater than a length Lc1c2 from the negative Y-axis direction end portion of the contact hole 54 in the transistor section 70-3 to the positive Y-axis direction end portion of the contact hole 156 in the diode section 80. Due to such a configuration, the lifetime killer region 19 can prevent an excessive amount of holes to flow into the cathode region 82 when the diode section 80 is operated.

The length Lc1k-1 may be less than the length Ly. In this case as well, the lifetime killer region 19 can prevent an excessive amount of holes to flow into the cathode region 82 through a region in which the accumulation region 16 is not provided when the diode section 80 is operated. The length Lc1k-1 may be less than the length Lc2ny. In this case as well, the lifetime killer region 19 can realize a similar effect.

In the present example, a Y-axis direction length from the positive Y-axis direction end portion 119 of the lifetime killer region 19 to the boundary between the cathode region 82 and the collector region 22 is referred to as Lkny. In the present example, a length corresponding to the end portion 119-1 is referred to as Lkny-1, a length corresponding to the end portion 119-2 is referred to as Lkny-2 and a length corresponding to the end portion 119-3 is referred to as Lkny-3.

The lengths Lkny-1, Lkny-2 and Lkny-3 may be greater than the Z-axis direction thickness of the semiconductor substrate 10. The lifetime killer region 19 having such a configuration can prevent an excessive amount of holes to flow into the cathode region 82 during operation of the diode section 80.

Note that, in another example, a $P^+$-type well region 17 may be provided to surround the second portion 48 of the gate trench portion 40 as indicated by dashed line. In this case, the well region 17 may cover the side portions and the bottom portion of the second portion 48 of the gate trench portion 40. The well region 17 may cover the entire second portion 48 of the gate trench portion 40 by extending in the X-axis direction. In this manner, increase in the electric field strength at the bottom portion of the second portion 48 of the gate trench portion 40 can be prevented.

The positive Y-axis direction end portion of the well region 17 may be spaced from the end portion 53 of the contact hole 54 in the transistor section 70-3. Also, the negative Y-axis direction end portion of the well region 17 may be positioned closer to the transistor section 70-3 than the contact hole 156 closest to the transistor section 70-3 in the diode section 80. The negative Y-axis direction end portion of the well region 17 may be positioned between the second portion 48 of the gate trench portion 40 and the second portion 38 of the dummy trench portion 30 in the diode section 80.

Figure 18:
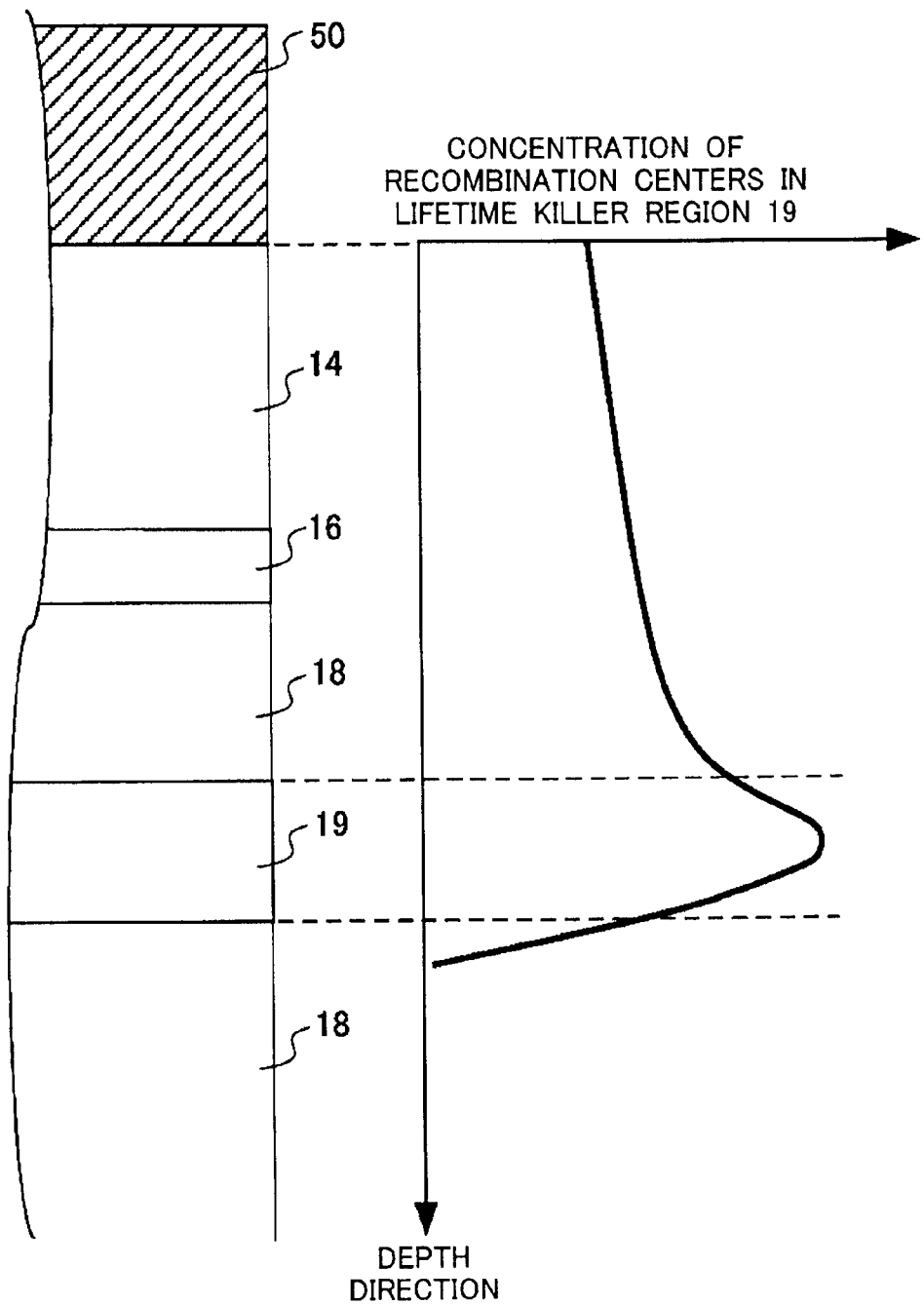
FIG. 18 shows a concentration distribution of recombination centers in a lifetime killer region 19.

FIG. 18 shows a concentration distribution of recombination centers in the lifetime killer region 19. In the present example, the concentration distribution of recombination centers in the lifetime killer region 19 has a peak in the depth direction. Also, in the present example, the concentration distribution of recombination centers in the lifetime killer region 19 has a tail region that reaches the upper surface of the semiconductor substrate 10. Note that the concentration distribution of recombination centers in the lifetime killer region 19 may have a tail region that reaches the lower surface of the semiconductor substrate 10 instead of the tail region that reaches the upper surface.

The recombination centers may be formed by point defects (such as vacancies, divacancies and dangling bonds) formed inside the semiconductor substrate 10 by introducing light ion such as helium or metal such as platinum, as described above. Further, the concentration of recombination centers may be the concentration of point defects, or may be the concentration of helium or metal. The lifetime killer region 19 shown in FIG. 18 may include a position at which the concentration of recombination centers assumes its local maximum (peak). Also, the depth direction width of the lifetime killer region 19 may be a full width at half maximum of the peak concentration of introduced helium, point defects or recombination centers. The concentration distribution of recombination centers may have a mountain-like distribution shape including a peak.

Figure 19:
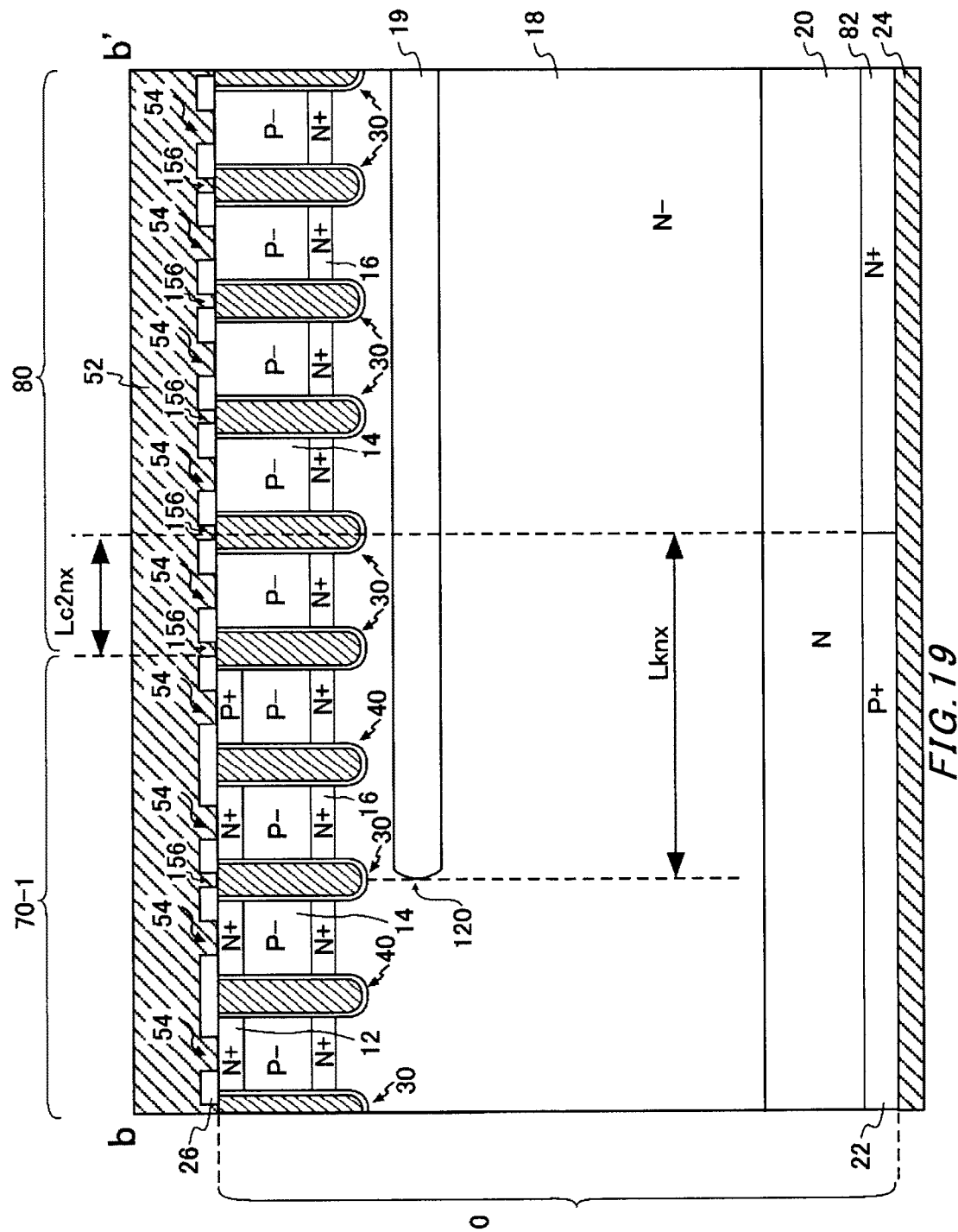
FIG. 19 is a cross-sectional view taken along b-b' in FIG. 16.

FIG. 19 is a cross-sectional view taken along b-b' in FIG. 16. The cross-sectional view taken along b-b' is in parallel with the X-Z plane. The line b-b' passes through a plurality of emitter regions 12 in the transistor section 70-1 and the diode section 80. In the present example, an X-axis direction length from the positive X-axis direction end portion 120 of the lifetime killer region 19 to the boundary between the cathode region 82 and the collector region 22 is referred to as Lknx. The length Lknx may be greater than the thickness of the semiconductor substrate 10.

In FIG. 19, a mesa portion 94 between dummy trench portions 30 in the diode section 80 is provided with a base region 14 but not provided with an emitter region 12 and a contact region 15. The collector region 22 may extend from a region below an emitter region 12 positioned at the negative X-axis direction end portion toward the diode section 80. The collector region 22 of the present example extends to a region below a mesa portion 94 in which a base region 14 is provided and an emitter region 12 and a contact region 15 are not provided. The collector region 22 may extend across a plurality of mesa portions in the diode section 80.

In the present example, a length from the positive X-axis direction end portion of a contact hole 156 on a dummy trench portion 30 positioned at the positive X-axis direction end portion of the diode section 80 to the boundary between the cathode region 82 and the collector region 22 is referred to as Lc2nx. The length Lc2nx may be greater than the Z-axis direction thickness of the semiconductor substrate 10 and may be less than the length Lknx. In the present example, the length Lc2nx is 50 μm.

Figure 20:
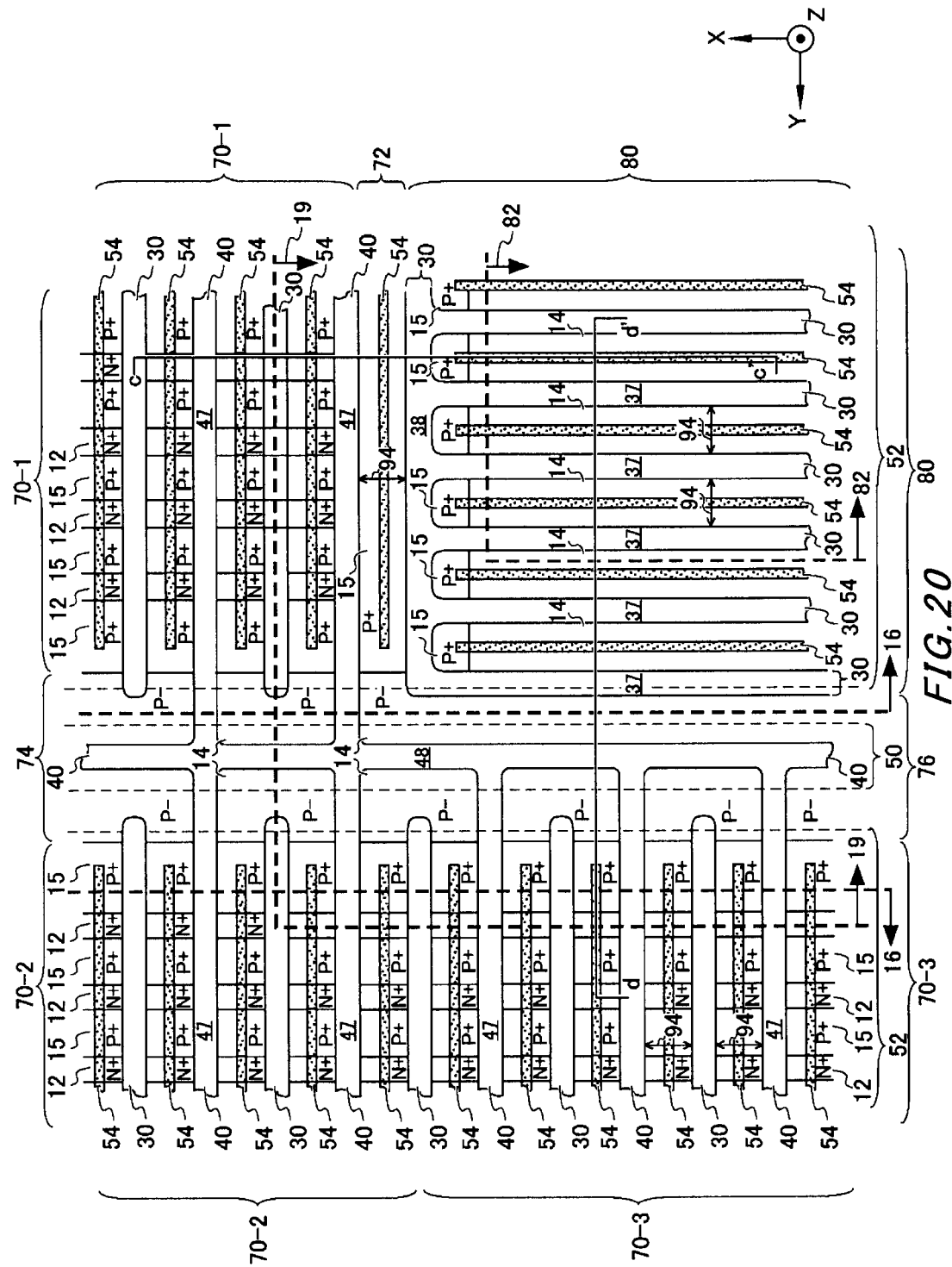
FIG. 20 shows a variation of FIG. 16.

FIG. 20 shows a variation of FIG. 16. In the present example, the comb teeth-shaped dummy trench portion 30 may include a first portion 37 extending in the X-axis direction and a second portion 38 extending in the Y-axis direction. That is, in the diode section 80 of the present example, a plurality of first portions 37 are provided being spaced from each other in the Y-axis direction. Also, in the diode section 80, the second portion 38 is connected to the positive X-axis direction end portions of a plurality of first portions 37. In the present example, the first portion 47 of the gate trench portion 40 and the first portion 37 of the dummy trench portion 30 are orthogonal to each other. It is the difference from the example in FIG. 16. The cathode region 82 may be positioned on an inner side (negative X-axis direction side) relative to the second portion 38 of the dummy trench portion 30 in the diode section 80. Also, the cathode region 82 may be positioned on an inner side (negative X-axis direction side) relative to the positive X-axis direction end portion of the contact hole 54.

A mesa portion 94 which is between the transistor section 70-1 and the second portion 38 of the dummy trench portion 30 in the diode section 80 and has the contact region 15 formed therein to surround the entire contact hole 54 may be referred to as a first boundary section 72. A region which: ranges from an end of the contact region 15 in the transistor section 70-1 that is adjacent to the second portion 48 of the gate trench portion 40 to an end of the contact region 15 in the transistor section 70-2 that is adjacent to the second portion 48 of the gate trench portion 40 and includes the second portion 48 of the gate trench portion 40 may be referred to as a second boundary section 74. A region which: ranges from an end of the contact region 15 in the transistor section 70-3 that is adjacent to the second portion 48 of the gate trench portion 40 to a first portion 37 of the dummy trench portion 30 in the diode section 80 that is positioned farthest in the positive Y-axis direction; and includes the second portion 48 of the gate trench portion 40 may be referred to as a third boundary section 76.

The second boundary section 74 and the third boundary section 76 may be in contact in the X-axis direction. The first boundary section 72 may cross the second boundary section 74 or the third boundary section 76. The Y-axis direction width of a mesa portion 94 between the second portion 48 of the gate trench portion 40 and a first portion 37 of the dummy trench portion 30 in the diode section 80 which is adjacent to that portion and positioned farthest in the positive Y-axis direction may be the same as or less than the X-axis direction width of a mesa portion 94 in the transistor section 70 or the diode section 80. In this manner, a potential distribution at the bottom portion of a trench portion when a gate voltage is OFF and a source voltage is applied between the collector electrode 24 and the emitter electrode 52 is made uniform, and local increase in the electric field strength at the bottom portion of the trench portion is suppressed.

Figure 21:
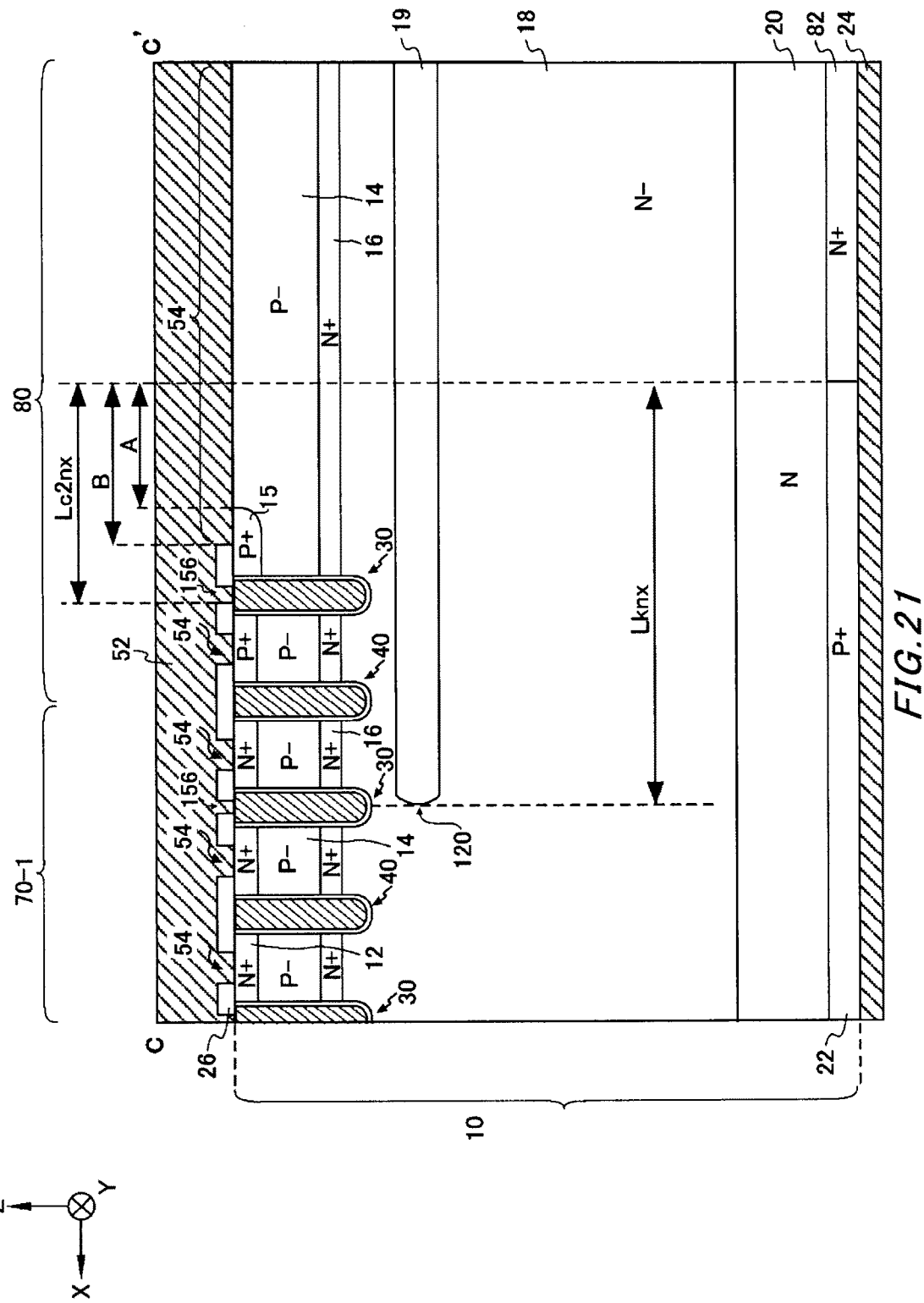
FIG. 21 is a cross-sectional view taken along c-c' in FIG. 20.

FIG. 21 is a cross-sectional view taken along c-c' in FIG. 20. The cross-sectional view taken along c-c' is is parallel with the X-Z plane. The line c-c' passes through a plurality of emitter regions 12 in the transistor section 70-1, the second portion 38 of the dummy trench portion 30 in contact with the first boundary section 72, and a contact hole 54 on a mesa portion 94 positioned between two first portions 37 of the dummy trench portion 30 in the diode section 80. In the present example as well, a Y-axis direction length from the positive X-axis direction end portion 120 of the lifetime killer region 19 to the boundary between the cathode region 82 and the collector region 22 is referred to as Lknx. The length Lknx may be greater than the thickness of the semiconductor substrate 10.

The collector region 22 may extend from a region below an emitter region 12 positioned at the negative X-axis direction end portion toward the diode section 80. The collector region 22 of the present example extends beyond the second portion 38 of the dummy trench portion 30 in the diode section 80 to a position below a region in which a base region 14 is provided but an emitter region 12 and a contact region 15 are not provided in the diode section 80.

In the present example, a length from the positive X-axis direction end portion of a contact hole 156 on a dummy trench portion 30 positioned at the positive X-axis direction end portion of the diode section 80 to the boundary between the cathode region 82 and the collector region 22 is referred to as Lc2nx. The length Lc2nx may be greater than the Z-axis direction thickness of the semiconductor substrate 10 and may be less than the length Lknx. In the present example, the length Lc2nx is 50 μm.

Figure 22:
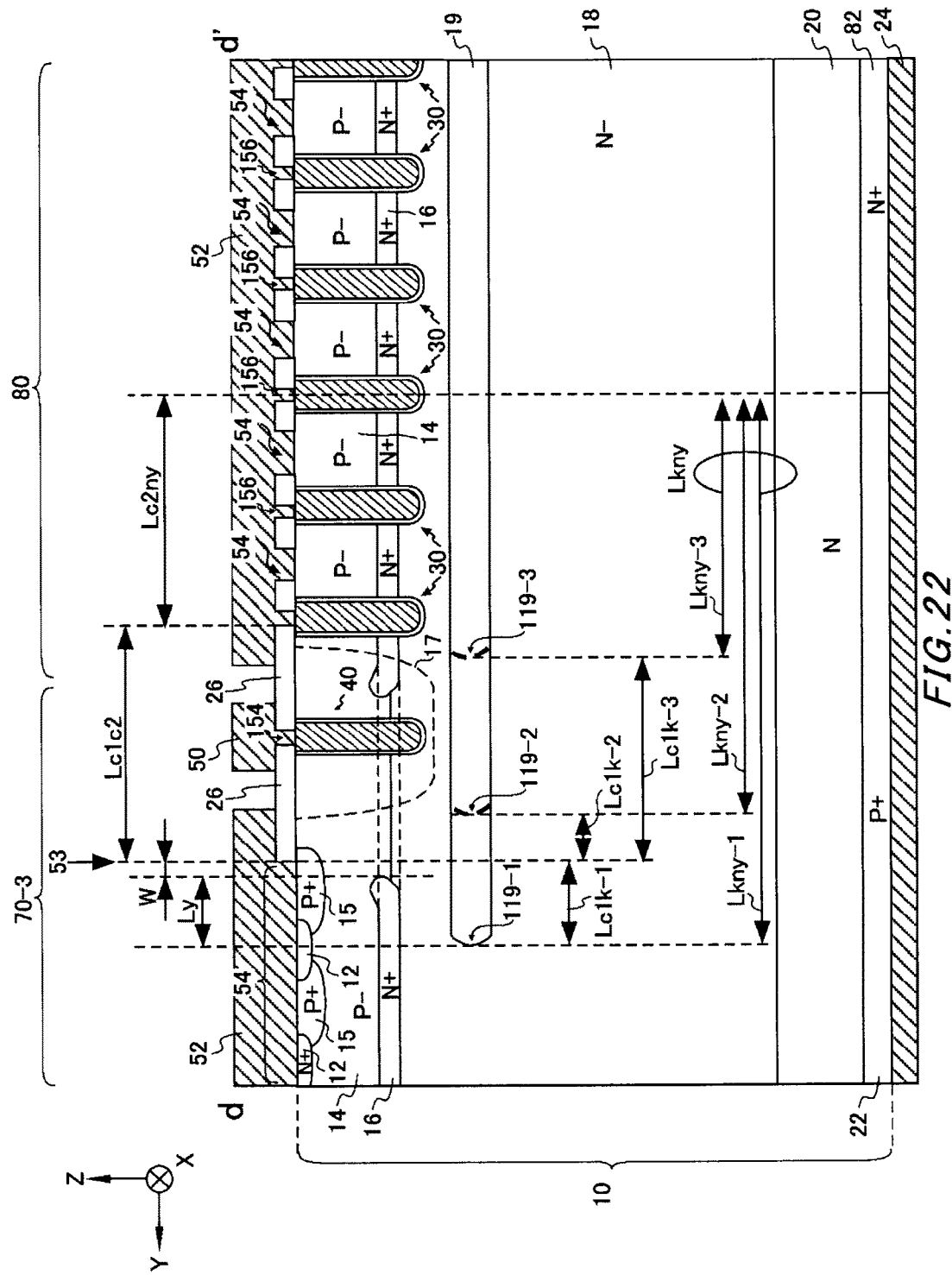
FIG. 22 is a cross-sectional view taken along d-d' in FIG. 20.

FIG. 22 is a cross-sectional view taken along d-d' in FIG. 20. The cross-sectional view taken along d-d' is in parallel with the Y-Z plane. The line d-d' passes through a contact hole 54 provided on a mesa portion 94 and the second portion 48 of the gate trench portion 40 in the transistor section 70-3, and a plurality of contact holes 54 provided on mesa portions 94 and a plurality of first portions 37 of the dummy trench portion 30 in the diode section 80.

The accumulation region 16, the lengths Ly, W and Lc2any, and the lifetime killer region 19 may be the same as those described with reference to FIG. 17. In a similar manner to the description with reference to FIG. 17, by virtue of the lengths Lc1k-1, Lc1k-2 and Lc1k-3, the lifetime killer region 19 can prevent an excessive amount of holes from flowing into the cathode region 82 during operation of the diode section 80. Note that, in another example, a P$^+$-type well region 17 may be provided to surround the second portion 48 of the gate trench portion 40, as described with reference to FIG. 17.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

10: semiconductor substrate; 12: emitter region; 14: base region; 15: contact region; 16: accumulation region; 17: well region; 18: drift region; 19: lifetime killer region; 20: buffer region; 22: collector region; 24: collector electrode; 26: interlayer insulating film; 30: dummy trench portion; 32: dummy insulating film; 34: dummy conductive portion; 36: dummy trench; 37: first portion; 38: second portion; 40: gate trench portion; 41: opposing portion; 42: gate insulating film; 43: protruding portion; 44: gate conductive portion; 46: gate trench; 47: first portion; 48: second portion; 50: gate metal layer; 51: gate runner; 52: emitter electrode; 53: end portion; 54, 55, 56: contact hole; 57: connecting portion; 58: insulating film; 62: flat region; 64: end region; 70: transistor section; 72: first boundary section; 74: second boundary section; 76: third boundary section; 80: diode section; 82: cathode region; 84: high-concentration first conductivity-type region; 86: high-concentration second conductivity-type region; 90: boundary section; 94: mesa portion; 100: semiconductor device; 110: mask; 112: excess portion; 119, 120: end portion; 154, 156: contact hole; 200: semiconductor device; 210: mask; 212: excess portion; 300, 400: semiconductor device

What is claimed is:

1. A semiconductor device comprising:
   a semiconductor substrate;
   a transistor section provided in the semiconductor substrate; and
   a diode section provided in the semiconductor substrate being adjacent to the transistor section; wherein
   the diode section comprises:
      a second conductivity-type anode region at least partially exposed on an upper surface of the semiconductor substrate;
      a first conductivity-type drift region provided below the anode region;
      a first conductivity-type cathode region provided below the drift region;
      a plurality of dummy trench portions that penetrate at least the anode region and are arrayed along a predetermined array direction;
      a contact portion provided along an extending direction of the plurality of dummy trench portions that is different from the array direction; and
      a second conductivity-type lower-surface side semiconductor region provided below the drift region and provided directly below an outer end portion of the contact portion in the extending direction.

2. The semiconductor device according to claim 1, further comprising:
   a first conductivity-type accumulation region having a higher first conductivity-type doping concentration than the drift region;
   wherein the transistor section comprises:
      a first conductivity-type emitter region exposed on the upper surface of the semiconductor substrate;
      a second conductivity-type base region at least partially provided below the emitter region;
      a first conductivity-type drift region provided below the base region;
      a plurality of gate trench portions that penetrate at least the base region and extend in the extending direction;
   wherein the first conductivity-type accumulation region is provided between the base region and the drift region in the transistor section, and between the anode region and the drift region in the diode section; and
   wherein the lower-surface side semiconductor region is provided directly below a portion of the accumulation region in the diode section, the portion being at an outer end of the accumulation region in the extending direction.

3. The semiconductor device according to claim 2, wherein:
   an outer end portion of the accumulation region in the extending direction is provided on an inner side relative to an outer end portion of the contact portion in the extending direction; and
   the lower-surface side semiconductor region is provided continuously at least from a position directly below an outer end portion of the contact portion in the extending direction to a position directly below an end portion of the accumulation region in the extending direction.

4. The semiconductor device according to claim 3, wherein a length from a portion of the lower-surface side semiconductor region at an end in the extending direction to a portion of the accumulation region at an outer end in the extending direction is greater than a length from a portion of the accumulation region at an outer end in the extending direction to a portion of the contact portion at an outer end in the extending direction.

5. The semiconductor device according to claim 3, wherein a length from a portion of the lower-surface side semiconductor region at an end in the extending direction to a portion of the accumulation region at an outer end in the extending direction is less than a length from a portion of the accumulation region at an outer end in the extending direction to a portion of the contact portion at an outer end in the extending direction.

6. The semiconductor device according to claim 2, wherein the lower-surface side semiconductor region is provided continuously to a position 200 µm or more inner from a portion of the accumulation region at an outer end in the extending direction.

7. The semiconductor device according to claim 2, wherein:
a portion of the accumulation region at an outer end in the extending direction is provided on an inner side relative to a portion of the contact portion at an outer end in the extending direction; and
the lower-surface side semiconductor region is provided continuously at least from a position directly below a portion of the contact portion at an outer end in the extending direction to a position at an outer side relative to a position directly below a portion of the accumulation region at an end in the extending direction.

8. The semiconductor device according to claim 2, wherein a region of the accumulation region at an end in the extending direction is provided such that a depth of the region at a more outer side is shallower.

9. The semiconductor device according to claim 1, wherein the diode section comprises, between the plurality of dummy trench portions, a high-concentration second conductivity-type region having a higher second conductivity-type doping concentration than the anode region and a high-concentration first conductivity-type region having a higher first conductivity-type doping concentration than the drift region.

10. The semiconductor device according to claim 9, wherein the high-concentration first conductivity-type region and the high-concentration second conductivity-type region extend in the extending direction and are adjacent to each other in the array direction.

11. The semiconductor device according to claim 9, wherein the high-concentration first conductivity-type region and the high-concentration second conductivity-type region extend in the array direction and are adjacent to each other in the extending direction.

12. The semiconductor device according to claim 1, wherein the transistor section comprises a plurality of gate trench portions, and
the plurality of gate trench portions comprise:
a first portion extending along the extending direction; and
a second portion which extends in the array direction and is connected to portions of a plurality of the first portions at an end in the extending direction.

13. The semiconductor device according to claim 12, wherein the second portion is connected to portions of three or more of the first portions at an end in the extending direction.

14. The semiconductor device according to claim 12, wherein the plurality of dummy trench portions in the diode section comprise:
a first portion extending along the extending direction; and
a second portion which extends in the array direction and is connected to portions of a plurality of the first portions at an end in extending direction.

15. The semiconductor device according to claim 14, wherein the second portion is connected to portions of three or more of the first portions at an end in the extending direction.

16. The semiconductor device according to claim 14, wherein the first portion of the plurality of gate trench portions and the first portion of the plurality of dummy trench portions are parallel to each other.

17. The semiconductor device according to claim 14, wherein the first portion of the plurality of gate trench portions and the first portion of the plurality of dummy trench portions are orthogonal to each other.

18. The semiconductor device according to claim 14, wherein the diode section comprises a lifetime killer region.

19. The semiconductor device according to claim 18, wherein the lifetime killer region extends to an outer side of the diode section relative to the first portion of the plurality of dummy trench portions.

20. The semiconductor device according to claim 18, wherein the lifetime killer region extends to an outer side of the diode section relative to the second portion of the plurality of dummy trench portions.

21. The semiconductor device according to claim 20, wherein:
each of the plurality of gate trench portions comprises a gate conductive portion provided in contact with a gate insulating film and on an inner side of each of the plurality of gate trench portions relative to the gate insulating film;
the semiconductor device further comprises a gate metal layer which is provided outside the transistor section or the diode section in top view of the semiconductor substrate and is electrically connected to the gate conductive portion; and
the lifetime killer region extends outside the gate metal layer.

22. The semiconductor device according to claim 18, wherein the lifetime killer region extends to an outer side relative to the second portion of the plurality of gate trench portions.

23. The semiconductor device according to claim 18, wherein a depth from the upper surface of the semiconductor substrate to the lifetime killer region is less than a depth from the lifetime killer region to a lower surface of the semiconductor substrate.

24. The semiconductor device according to claim 1, wherein the anode region in the diode section is provided directly below the outer end portion of the contact portion in the extending direction.

25. The semiconductor device according to claim 24, wherein an end portion of the cathode region in the extending direction is directly below the contact portion.

26. The semiconductor device according to claim 24, wherein a thickness of the anode region below the outer end portion of the contact portion is substantially the same as a thickness of the anode region above the cathode region.

* * * * *